United States Patent [19]

Ahuja

[11] Patent Number: 4,653,084

[45] Date of Patent: Mar. 24, 1987

[54] REMOTE ACTUATED SWITCH

[76] Inventor: Om Ahuja, 89 Clearmeadow Dr., East Meadow, N.Y. 11554

[21] Appl. No.: 753,704

[22] Filed: Jul. 10, 1985

Related U.S. Application Data

[63] Continuation-in-part of Ser. No. 633,107, Jul. 20, 1984, abandoned.

[51] Int. Cl.⁴ ............................................. H04B 3/46
[52] U.S. Cl. ................................... 379/29; 307/252 B
[58] Field of Search .................. 179/175.3 R, 175.3 F, 179/175, 175.1 R, 81 R, 17 A, 99 R; 307/252 B, 252 T; 324/52

[56]     References Cited

U.S. PATENT DOCUMENTS

| | | | |
|---|---|---|---|
| 3,916,111 | 10/1985 | Ott | 179/17 E |
| 4,021,617 | 5/1977 | Jones, Jr. et al. | 179/17 E |
| 4,052,624 | 10/1977 | Hamstra | 307/252 B |
| 4,054,942 | 10/1977 | Chambers, Jr. | 179/17 A |
| 4,056,694 | 11/1977 | Brolin | 179/84 R |
| 4,079,205 | 3/1978 | Glenn | 179/17 A |
| 4,099,031 | 7/1978 | Proctor et al. | 179/17 A |
| 4,149,040 | 4/1979 | Atkinson | 179/17 A |
| 4,209,667 | 6/1980 | Simokat | 179/17 A |
| 4,221,935 | 9/1980 | Barsellotti et al. | 179/17 E |
| 4,293,737 | 10/1981 | Cepelinski | 179/17 E |
| 4,310,723 | 1/1982 | Svala | 179/17 A |
| 4,323,799 | 4/1982 | King et al. | 307/571 |
| 4,324,953 | 4/1982 | Simokat | 179/17 A |
| 4,331,838 | 5/1982 | Simokat | 179/17 E |
| 4,373,121 | 2/1983 | Sartori et al. | 179/175.3 F |
| 4,396,809 | 8/1983 | Brunssen | 179/175.3 F |
| 4,403,115 | 9/1983 | Simokat | 179/17 A |
| 4,438,299 | 3/1984 | Tomin | 179/175.3 F |
| 4,445,001 | 4/1984 | Bertoglio | 179/17 A |
| 4,489,221 | 12/1984 | Walker et al. | 179/19 |
| 4,529,847 | 7/1985 | DeBalko | 179/175.3 F |

OTHER PUBLICATIONS

*General Electric*, published by Prentice Hall Inc., N.J., "SCR Manual Sixth Edition", pp. 435–436.
*Bell Laboratories Record*, "Switching to Solid State Relays", pp. 31–37, published in Feb. or 1978.
Disclosure Document No. 119121, filed Jul. 27, 1983 for "Maintenance Termination Unit" (per Bell Pub.: 55022).

*Primary Examiner*—Stafford D. Schreyer
*Attorney, Agent, or Firm*—Scully, Scott, Murphy & Presser

[57]     ABSTRACT

A solid state remotely actuable switch is described for testing and remotely disconnecting a circuit. In one embodiment, a solid state bilateral switch such as a triac is connected in series with the remote circuit, and a trigger device such as a diac is connected between the gate of the triac and the remote circuit. The switch is placed within the tip and ring line of a telephone circuit for remotely disconnected the telephone subscriber's side for testing the remote circuit. In a second embodiment, a remotely actuable switch includes a field effect transistor connected in series with each tip and ring circuit, a resistance-capacitance time-constant circuit for energizing the FETs and a discharging means for discharging the capacitor of the resistance-capacitance circuit in response to the control signal from the central office. Various devices for disconnecting subscriber circuits are disclosed.

47 Claims, 21 Drawing Figures

REMOTE ACTUATED SWITCH

REFERENCE TO RELATED APPLICATION

This application is a continuation-in-part of the applicant's U.S. application Ser. No. 633,107, filed Jul. 20, 1984, now abandoned.

BACKGROUND OF THE INVENTION

This invention relates generally to the field of telephone communications, and more particularly to a variety of solid state switches to be used as series elements in telephone lines between the telephone central office and the subscribers.

In the past, many solid state switches have been designed and applied in the various fields using relays, darlingtons, or bipolar transistors. However, these switches are not desirable for telecommunications because they require heavy base currents to keep them "on" or a power source to actuate them. If a remote power source is required, then electrical service must be provided within the customer's house at the point of network line termination. Darlington switches may be used to reduce the above-referenced base current requirement, but there is a large voltage drop across a Darlington solid state switch. These solutions are not acceptable, especially where the subscriber is at a distance away from the central office. Due to the long loop length and large voltage drop in the line, a solid state switch would normally add undesirable voltage drop to the already low current made available for the talk circuit.

DESCRIPTION OF THE PRIOR ART

U.S. Pat. No. 4,323,799 issued to King et al., discloses a time delay remote disconnect switch for use in a telephone system. The switch includes a field effect transistor (FET) that is switched on and off by the voltage produced by an illuminated series connected photodiode array connected to the FET. A resistive-capacitive timing circuit determines the time interval between the on and off states of the FET.

U.S. Pat. No. 4,373,121 issued to Satori, et al. discloses a fault detection device having a four layer diode switch connected in series with each of the subscriber loop conductors, tip and ring, of the telephone lines. In addition, identical impedance networks are connected between the loop conductors and ground on the telephone utility side of the switches. Each of the networks presents a unique impedance in response to an AC signal. In a first set of tests DC signals are applied to the loop conductor to determine if a fault exists. In addition, AC signals are also applied to the loops and if the unique impedance is detected it is determined that an MTU device is in the line. In order to determine where a problem exists, a second set of DC signal tests are performed wherein the voltage is dropped to below the threshold voltage of the four layer diodes so that the diodes will not conduct. If a DC current is detected, the problem exists on the utility side of the line.

In U.S. Pat. No. 4,438,299 issued to Tomin, a telephone trouble shooting apparatus is disclosed having two voltage sensitive unilateral solid state switches, one connected to the tip line and other connected to the ring line. Each of the unilateral switches has a blocking diode for blocking conduction in the direction running opposite that of the direction of conduction of the unilateral voltage sensitive switches. A termination circuit consisting of a resistor 22 and a diode 24 is connected across the tip and ring lines. By using a test voltage below that which the solid state switches will conduct, the customer side of the line is disconnected. Depending on whether or not the resistor 22 or an open circuit is detected upon testing in opposite polarities, it can be determined whether the problem exists on the company side or on the customer side on the apparatus.

SUMMARY OF THE INVENTION

Numerous circuits related to the telephone loop are presented here which embody the instant invention. The different applications are dealt with appropriately in the description of each individual circuit. The solid state switch in each case performs the function of disconnecting the subscriber side of the equipment from the network/central office side of the equipment.

The present invention employs solid state unilateral and bilateral switches having a gate for rendering the switch conductive in response to predetermined control voltages and/or currents. Bilateral switches are in turn actuated by one or more devices in response to control signals from the telephone central office.

The present invention provides two different approaches to solving the problem:

(a) Sensitive gate triacs are used in the case where on demand the triac is fired (triggered) and once in the "on" state the same remains "on" until the loop current drops below the holding current of the device.

(b) By using FETs which require minimal power to turn them "on" and keep them on, the power will be supplied by the voltage available across the line. No external power is thus required to keep these devices in the "on" or the "off" state. Furthermore, the switches utilize minimum current generating circuitry.

In one embodiment of the remotely actuable switch a solid state switch is used in testing a remote telephone circuit which normally carries both alternating and direct current. This switch finds its primary application in a maintenance termination unit (MTU) for use by the telephone company in determining whether a problem exists within the subscribers home, or within the telephone service network. The MTU device is disclosed in detail in the applicant's co-pending application, Ser. No. 753-719, filed concurrently herewith on Jul. 10, 1985, the entire specification of which is hereby incorporated by reference. This switch employs a solid state bilateral switch such as a triac having first and second terminals that are connected in series with the remote telephone circuit. The bilateral switch or triac has a gate for rendering the switch conductive between the terminals in response to a predetermined current level. A solid state avalanche device such as a diac or two zener diodes connected back to back is connected between the gate and a second terminal of the bilateral switch. The avalanche device is responsive to a predetermined threshold voltage to render the solid state switch voltage sensitive. The solid state switch is conductive only in the presence of the threshold voltage and the predetermined current level.

The remote bilateral switch normally passes both alternating current and direct current, the alternating current being present during ring conditions, and the direct current, known as talk battery, being present at all times. The bilateral switch or triac is normally transparent to and conductive for both alternating and direct currents that are normally encountered in the circuit at the remote location. However, the switch may be selectively rendered conductive or non-conductive for test purposes by the application of a test voltage above or below a predetermined threshold voltage applied at the central office.

Other embodiments of the remotely actuated switch include field effect transistors. The switch includes at least one field effect transistor connected in series with each of the tip and ring circuits of the telephone system. A resistance-capacitance time constant circuit is connected across each of the FETs for normally energizing the FETs. The capacitor is charged by a control voltage from the central office which sustains the FETs in the energized state for as long as the capacitor is charged. A diode bridge provides proper polarity to the capacitor and FETs regardless of the polarity of the control voltage across tip and ring. A means for discharging the resistive-capacitive circuit in response to a control signal from the central office is also provided. Thus, the remotely actuable switch can be rendered non-conductive by the discharge of the capacitor in the resistive-capacitive circuit for a period of time equal to the time constant of the RC circuit.

Both unilateral and bilateral switches can be provided using the FETs. In the unilateral switch, the source and drain terminals of each FET are connected in series with its respective tip and ring circuit and the gate terminals of each of the FETs are connected together. In the bilateral switch, an n-channel and a p-channel FET are connected in series with each of the tip and ring circuits. The source and drain terminals of each of the FETs are connected in series with each of the respective tip and ring circuits. The gate terminals of the n-channel FETs are connected together and the gate terminals of the p-channel FETs are connected together.

Several disconnect means for rendering the switches nonconductive are disclosed herein. The devices for disconnecting the switches may utilize polarity decoding, frequency decoding or DC activated circuits. In each case, the switch is remotely actuated by polarity encoding, frequency encoding or voltages supplied from the central office.

Several tone activated remote disconnect devices are provided using the remotely actuable switches of the present invention. One such tone activated device is a non-payment line disconnect wherein the central office may initiate a tone control signal that will enable incoming calls but prevent the subscriber from making outgoing calls. In another embodiment, the central office may additionally deny both incoming and outgoing calls by sending a control signal of a different frequency. In these embodiments, a tone decoder will decode the particular tone from the central office to set a latching circuit to open the normally closed FETs. Upon payment of the delinquent bill, the central office can send a further tone signal that will be decoded to reset the latch and close the FETs to restore the line to full service.

An automatic permanent release device is also provided to enable the central office to clear a party line that has a permanent condition such as a phone off-hook, a coin stuck in the pay station or where the line becomes grounded. The releasing of the permanent condition stops a multiparty line from being tied up and permits the central office to see an on-hook condition. Once a permanent condition occurs on the line, the central office will send an off-hook tone signal down the line. The off-hook signal can be decoded by a detector and through a latching means the normally closed FETs will be opened. A delay circuit is provided to give the customer a warning that the phone is off-hook to permit him to return it to the on-hook position before the device becomes activated. If the phone is not placed on-hook within the predetermined delay time period, the output of the tone detector will set the latch to open the switches to free the line.

DETAILED DESCRIPTION OF THE INVENTION

Figure 1:
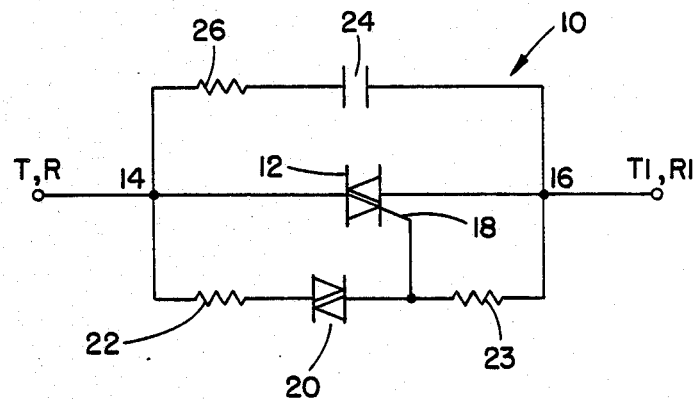
FIG. 1 is a schematic diagram of an embodiment of the remotely actuated switch including a triac.

Referring to the drawings, in particular FIG. 1, one embodiment of the remotely actuable switch 10 includes a bilateral solid state switch 12 having two terminals 14 and 16 connected in series with the remote circuit. In the telephone system, the remote circuit may be the tip and ring lines connecting the central office to the customer or subscriber telephones. Terminals T, R represent the central office side and terminals T1, R1 represent the customer side. The solid state switch 12 includes a gate 18 for rendering the switch conductive between terminal 12 and 14 in response to a predetermined gate trigger current level. The solid state switch 12 may be any bilateral solid state device such as a triac or a silicone bilateral switch (SBS).

A solid state avalanche device 20 is connected between the gate 18 and the terminal 14 to render the switch 12 voltage sensitive. The avalanche device 20 conducts only when the voltage across it exceeds the breakover voltage of the avalanche device 20. Thus, the switch 12 may be conductive only when the voltage across the remote circuit is at least at the breakover voltage of the avalanche device 20 plus the gate trigger voltage of the triac 12. The switch 12 is transparent to a voltage on the line greater than the threshold voltage while not being in a fully conductive state. Once the threshold voltage is present, switch 12 may be triggered on to full conduction by a current in the line drawn by the telephone being off hook or by the application of a ringing voltage by the central office. The current on the line must be equal to or greater than the gate trigger current to render the switch fully conductive. Thereafter, a current on the line called the latching current must be present to latch the switches into a fully conductive state. Once the switch 12 is on, the voltage in the line may drop substantially but the switch 12 will remain on until the current drops below a given minimum called the holding current.

The voltage and current sensitive switch 12 can be turned off by reducing the voltage below the threshold level for a sufficient period of time to permit the current to drop below the holding current. The customer side of the tip and ring lines can be remotely disconnected by the central office by removing the voltage across tip and ring causing the current to drop to zero. Thereafter, a test voltage below the threshold voltage can be placed on the tip and ring lines by the central office, to test the network side of the telephone system for a possible fault.

The avalanche device 20 may be any trigger device such as diac, SBS, sidac, zener diode, thyristor, transistor or even a neon lamp. The avalanche device 20 may be unidirectional or bidirectional or it may be two unidirectional devices connected back to back such as two zener diodes. A resistor 22 may be connected in series with the avalanche device 20 between the gate 18 and the terminal 14 in order to limit the current flow through the device 20, and the gate 18. Resistor 23, if connected into the circuit, between the gate 18 and terminal 16, provides noise and transient immunity, preventing switch 12 from inadvertently turning on. The current when flowing through resistor 22 and avalanche device 20 will first flow through resistor 23 and then through gate 18 only when the voltage drop across the resistor 23 exceeds the gate trigger voltage.

Figure 1A:
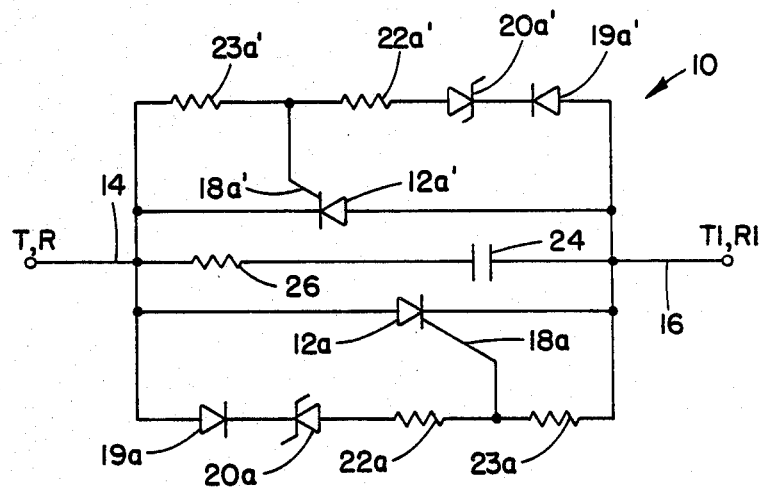
FIG. 1a is a schematic diagram of an embodiment of the remotely actuated switch including two SCRs.

FIG. 1a is another embodiment of the remotely actuable switch 10. The switch of FIG. 1a includes two unilateral solid state switches 12a and 12a', such as a silicon unilateral switch (SUS) or a silicon controlled rectifier (SCR). In addition, a combination of pnp and npn transistors, or p- and n-channel FETs, may be used to form an SCR. Each of switch 12a and 12a' are connected in parallel but in opposite polarities to each other. Thus, for example, the anode of 12a is connected to terminal 14 and the cathode of 12a is connected to terminal 16. The anode of 12a' is connected to terminal 16 and the cathode of 12a' is connected to terminal 14.

If the switches 12a and 12a' are SCRs, they include a gate 18a and 18a' respectively for rendering the switches conductive, through the series elements diode, 19a, zener diode 20a and resistor 22a which are connected between the anode and gate of switch 12a. Similarly, elements diode 19a', zener diode 20a' and resistor 22a' are connected between the anode and gate of switch 12a'.

If terminal 14 is potentially more positive with respect to terminal 16, the switch 12a with its associated components 19a, 20a, 22a and 23a will be forward biased. If the potential across terminals 14 and 16 is greater than the sum of the forward voltage drop of the diode 19a, the breakover voltage of the avalanche device 20a, plus the gate trigger voltage of the SCR 12a, then the gate current limited by the resistor 22a "triggers" or turns on the switch 12a.

Similarly, with terminal 16 potentially more positive with respect to terminal 14, the switch 12a' with its associated components 19a', 20a', 22a' and 23a' will be forward biased. If the potential across terminals 14 and 16 is greater than the sum of the forward voltage drop of the diode 19a', the breakover voltage of the avalanche device 20a', plus the gate trigger voltage of the SCR 12a', then the gate current limited by the resistor 22a' triggers on the switch 12a'.

The resistors 23a and 23a', if connected into the circuit between the gate 18a and 18a'and the cathodes of 12a and 12a' respectively, provide noise and transient immunity by preventing the SCRs from inadvertently turning on similar to the operation of the resistor 23 in FIG. 1.

Figure 1B:
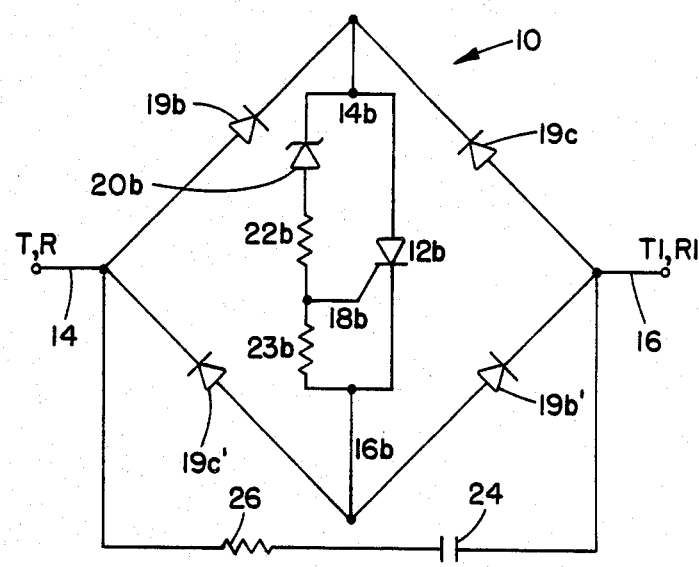
FIG. 1b is a schematic diagram of an embodiment of the remotely actuated switch including a SCR in a bridge circuit.

FIG. 1b is yet another embodiment of the remotely actuable switch 10. The switch of FIG. 1b includes one unilateral switch 12b within a bridge circuit formed by diodes 19b, 19b', 19c and 19c'. The unilateral solid state switch 12b may be an SUS, an SCR or the combination of pnp and npn transistors or p- and n-channel FETs forming an SCR.

If the switch 12b is an SCR, it includes a gate 18b to render the switch conductive, through the series elements zener diode 20b and resistor 22b, connected between the anode of switch 12b and the gate 18b.

If the potential across terminals 14 and 16 is greater than the sum of the forward voltage drops of the diodes 19b and 19b' or 19c and 19c', together with the breakover voltage of the avalanche device 20b and the gate trigger voltage of the SCR 12b, then the gate current limited by the resistor 22b triggers the switch 12b on.

The resistor 23b if connected into the circuit between the gate 18b and the cathode 16b, will provide noise and transient immunity by preventing the SCR from inadvertently turning on similar to the operation of the resistor 23 in FIG. 1 and the resistors 23a and 23a' in FIG. 1a.

Another means for suppressing voltage transients may be provided which can include a capacitor 24 and a resistor 26 connected in series across the terminals 14 and 16 as shown in FIG. 1, 1a and 1b.

The switch 10 as shown in FIGS. 1, 1a and 1b, is normally transparent and conductive for both alternating and direct currents. The switch may be selectively rendered conductive or non-conductive for test purposes by the application of a test voltage, above or below the breakover voltage of the avalanche device 20, 20a or 20b.

For a given polarity of potential between terminals 14 and 16, once the switch 10 is rendered conductive, the voltage across the terminals 14 and 16 drops to the on state forward voltage drop of the solid state switch 12 in FIG. 1. In FIG. 1a the voltage across the terminals 14 and 16 will be the on state forward voltage drop across switch 12a or 12a'. In FIG. 1b, the voltage across terminals 14 and 16 will be the sum of the forward voltage drops of the diodes 19b and 19b' or 19c and 19c' together with on state forward voltage drop of the switch 12b. These solid state switches stay on in full conduction until the current passing through them drops below the holding current of the solid state device.

Figure 2:
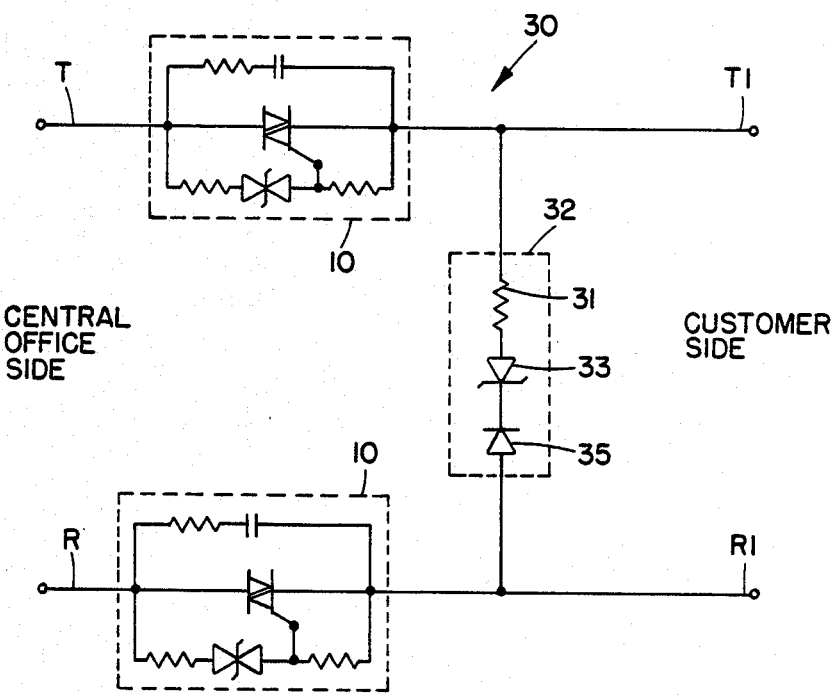
FIG. 2 is a schematic diagram of an MTU device.

One use of the solid state switch 10 is in connection with a Maintenance Termination Unit (MTU) remote disconnect device shown in FIG. 2. The MTU 30 consists of two solid state switches 10, one connected in series with the tip line and one connected in series with the ring line. The MTU 30 also includes a termination circuit 32 connected across the tip and ring lines on the customer side of the circuit. The termination circuit 32 includes a resistor 31, zener diode 33 and diode 35 connected in series across tip and ring. The diode 35 is polarized to conduct only from ring to tip so that the circuit 32 has no effect during a normal off hook condition or the talk mode, for which the voltage is polarized from tip to ring. When termination circuit 32 is conducting, the resistor 31 can be detected by the central office providing a signature identifying the presence of the MTU 30 in the circuit.

Normally, the central office maintains a talk battery voltage, approximately 48 volts dc, across the tip and ring line at all times. The threshold voltage of switches 10 is selected so that the combined threshold voltage is below the talk battery 48 volts. Preferably, the threshold voltage of each switch is 16 volts. No current is flowing in the line while the phone is on hook and therefore, the switch 10 will not be fully conductive but transparent to pass the talk battery voltage to the customer's phone. Upon a demand for current by the phone being placed off hook, the switch 10 will turn on provided there is sufficient voltage across tip and ring which exceeds the combined threshold voltages of the voltage sensitive switch 10. The current draw alerts the central office to provide a dial tone on the line. In addition, to ring the customer's phone, the central office applies an ac ringing voltage, nominally 100 volts, that actuates a ringer mechanism in the phone. The actuation of the ringer mechanism generates a demand for current that turns on the switch 10. Thus, in the normal on hook condition, the switch 10 is nonconductive.

When testing the line, the central office test desk will remove the 48 volt talk battery voltage and apply a 60–100 volt test battery voltage. The voltage is applied between each line and ground and across the line. The 60–100 volts being greater than the 16 volt line threshold and 32 volt line to line threshold voltage of the switch 10 permits the test desk to test the line to the customer's phone. The test desk then removes the 60–100 volt test battery and applies a 10 volt test voltage. The 10 volts is below both the line and line to line threshold voltages and therefore, the switch 10 will not pass the voltage. The threshold voltage of the switch 10 prevents the switches from becoming conductive due to a fault induced loop current. The presence of a short on the customer side of the switch 10 may generate a current that would otherwise turn on the switch 10. With the switch 10 rendered nonconductive, the test desk can test the network side of the line to determine the location of any faults detected during the 100 volt test. If the fault is seen again at the low voltage test the central office knows that the fault is on the network side. If the fault is not seen, the fault is on the customer's side.

Normally, the tip line is at positive and the ring line is at negative so that current will flow from tip to ring. The distinctive termination circuit 32 is reverse biased so that current will be blocked in the direction from tip to ring, but allowing current to flow from ring to tip. Therefore, in normal telephone operations, the termination circuit 32 will not be conducting. In testing for a fault, the central office will reverse the polarities so that the ring is positive and the tip is negative enabling current to flow through the termination circuit 32. The termination circuit 32 produces a distinctive signature that can be seen by the central office. Thus, while testing the lines, the central office will be able to determine whether a fault locating device is located at the termination of the telephone company line. In the event the MTU 30 is incorrectly connected within the line, the zener diode 33 is selected to have a breakover voltage of 16 volts, which combines with the breakover voltage of switch 10 to provide a total MTU breakover voltage greater than the normal talk battery voltage to prevent the circuit 32 from being seen at the central office during normal conditions.

Figure 3:
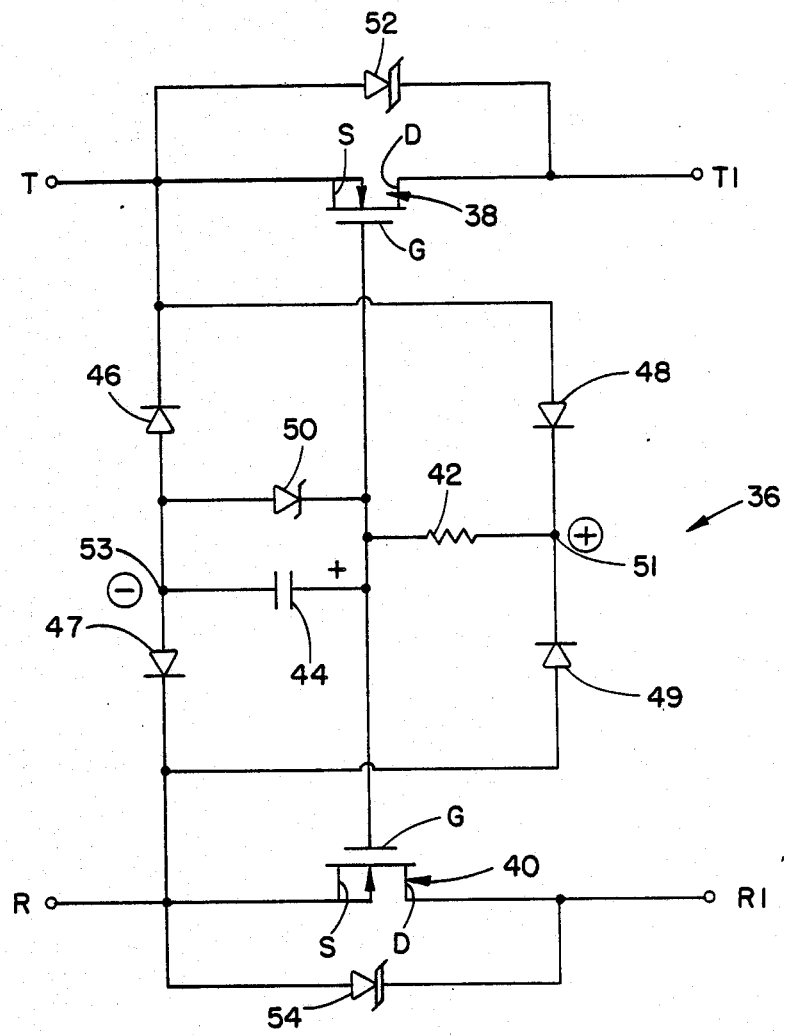
FIG. 3 is a schematic diagram of one embodiment of the remotely actuate switch using FETs.

A remotely actuable switch 36 using FETs is shown in FIG. 3. The switch in FIG. 3 includes an FET 38 in series with the tip line and an FET 40 in series with the ring line. Each FET 38 and 40 includes a source, drain and gate terminal designated S, D and G, respectively. The source and drain terminals are connected in series with the respective tip and ring lines. The gate terminals of each FET 38 and 40 are connected together. A diode bridge circuit, including diodes 46, 47, 48 and 49, is connected across the tip and ring circuit and has positive and negative terminals 51 and 53 respectively. A resistance-capacitance time-constant circuit including a resistor 42 and a capacitor 44, is connected across the positive and negative terminals 51 and 53 of the diode bridge.

The diodes 48 and 49 provide the positive potential to the RC circuit, while the diodes 46 and 47 connect the negative potential to the RC circuit. Thus, the diode bridge is a charge pump that permits the capacitor 44 to charge, through the resistor 48, regardless of whether the tip or ring circuit is positive.

For example, if tip is positive and ring is negative, diode 48 will be forward biased and current will flow through resistor 42 will charge capacitor 44 and return through diode 47 to the ring line. This will place a voltage potential at the gate of FET switch 40 to turn on FET 40. The voltage across the capacitor 44 and the gate of FET 40 is limited by the avalanche voltage of zener diode 50 connected across the capacitor 44.

When the phone is on hook, the normal 48 volt talk battery voltage across tip and ring, rectified through the bridge rectifier, keeps the capacitor 44 charged to sustain one of the FETs 38 or 40 in the on state. Normally, with tip positive and negative, FET 40 will be on. Therefore, the switch 36 is normally on. When FET 40 is turned on, current will flow from tip line T1 through the zener diode 52, from T1 to R1 through the telephone in the off hook state, and return through FET 40 to the ring line R. Similarly, with ring positive the current will flow through zener diode 54, the telephone and the FET 38. Thus, the diode bridge circuit acts as an intrinsic power supply for the switch, thereby eliminating the need for an external power supply. Furthermore, due to the diode bridge, a polarity reversal at the input during a central office cut-through on the line or during a ringing condition will not effect the switch 36.

The zener diode 50 connected across the capacitor 44 limits the voltage across the capacitor and therefore limits the voltage which is supplied to the gates of the FETs 38 and 40. In addition, zener diodes 52 and 54 are connected across the source and drain terminals of the FETs 38 and 40, respectively to provide high voltage protection and prevent secondary breakdown of the FETs. When the voltage across the FETs 38 and 40 exceeds the zener voltage of zener diode 52 and 54, the zeners avalanche and cause the excess voltage to be across the zeners, thus limiting the voltage across the FETs 38 and 40 to the zener voltage.

The FETs 38 and 40 are turned off by the central office by sending an appropriate signal down the line that will activate a discharge circuit (not shown) which discharges capacitor 44. The discharge circuit is connected across the capacitor 44 and when activated by the central office, places a short across the capacitor. Examples of discharge circuits are shown in FIGS. 7a-c, 8a, b, and 9 which will be described later. The short across the capacitor 44 shorts the gate to the source of each FET 38 and 40 preventing the biasing voltage from being present at the gates. Due to the fact that the zener diodes 52 and 54 are poled to normally conduct from the network side to the customer side of the switch 36, at least one zener will be blocking in either direction thereby preventing a flow of current in the loop and providing a disconnect between the network customer. The loop current will be blocked for a voltage below the threshold voltage of the blocking zener. Thus, the subscriber can be remotely disconnected to test the line for faults, to block service for nonpayment, release a permanent condition on the line or other similar applications.

Figure 4:
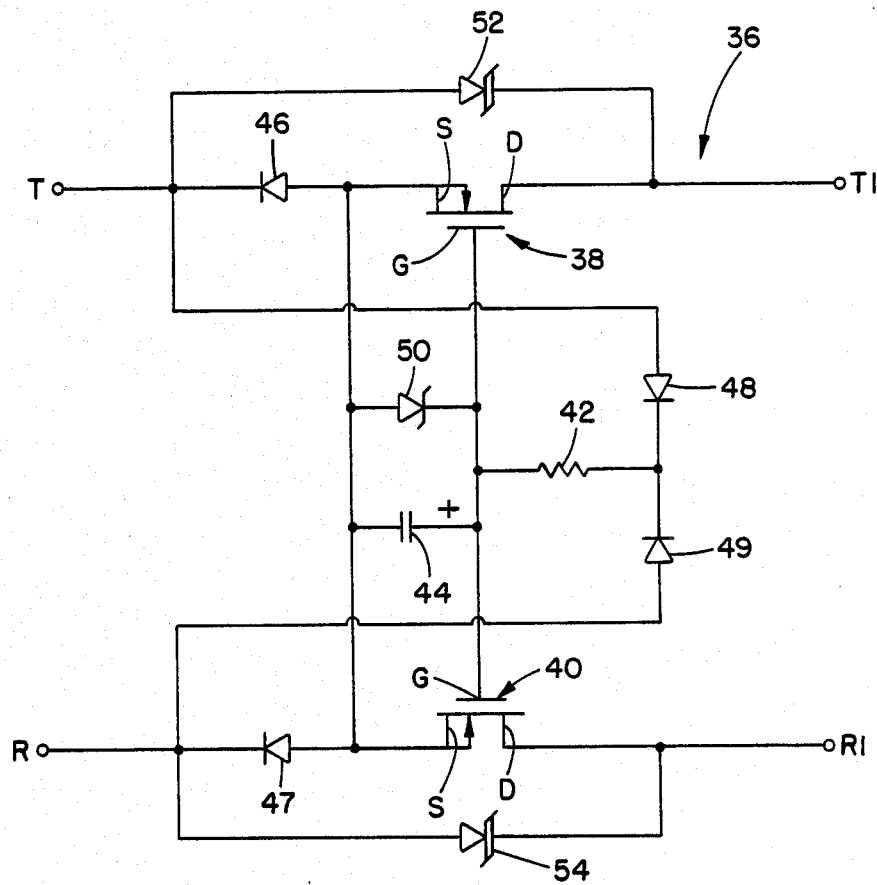
FIG. 4 is a schematic diagram of a modified switch as shown in FIG. 3.

FIG. 4 shows the modified version of the switch 36 wherein the diodes 46 and 47 are connected in series with the source terminal of the FETs 38 and 40, respectively. The diodes 46 and 47 provide a diode drop in the tip and ring line in series with the respective FET thus balancing the diode drop due to the zener diodes 52 and 54.

Referring to FIGS. 3 and 4, in operation while one FET is conducting, the drain-source protective zener of the other is in forward conduction from source to drain. For example, if tip is positive and ring is negative, then the diode 48 charges the capacitor 44 through the resistor 42, while the capacitor 44 is referenced to the negative, in this example to ring, through the diode 47. This provides that the FET 40 has its gate at the positive potential which is to the same amount as the voltage build across the capacitor 44. At the same time the zener 52 is forward biased from its anode to its cathode so that there is just one diode junction voltage drop in the conduction from the tip terminal T to the tip terminal T1 of the switch 36. If the voltage reverses so that the ring is positive and the tip is negative, zener diode 54 will be forward biased and instantaneously the gate of FET 38 will be at a positive potential with respect to its source due to the charge on the capacitor 44 and its reference to the negative leg, in this case to tip. Thus, FET 38 will be fully turned on and the flow of current thus would be from ring terminal R, through zener 54, to the ring terminal R1, through the telephone set, or subscriber equipment, back to the switch 36 via the tip terminal T1, through the FET 38, the capacitor 44, diode 46, and the tip terminal T. Due to the bridge rectification circuit formed by the diodes 46, 47, 48 and 49, the capacitor 44 continues to be charged in a positive manner notwithstanding which of the tip or ring lines is positive, so that there is never an interruption in service due to the reversal of voltage across tip and ring.

Figure 5:
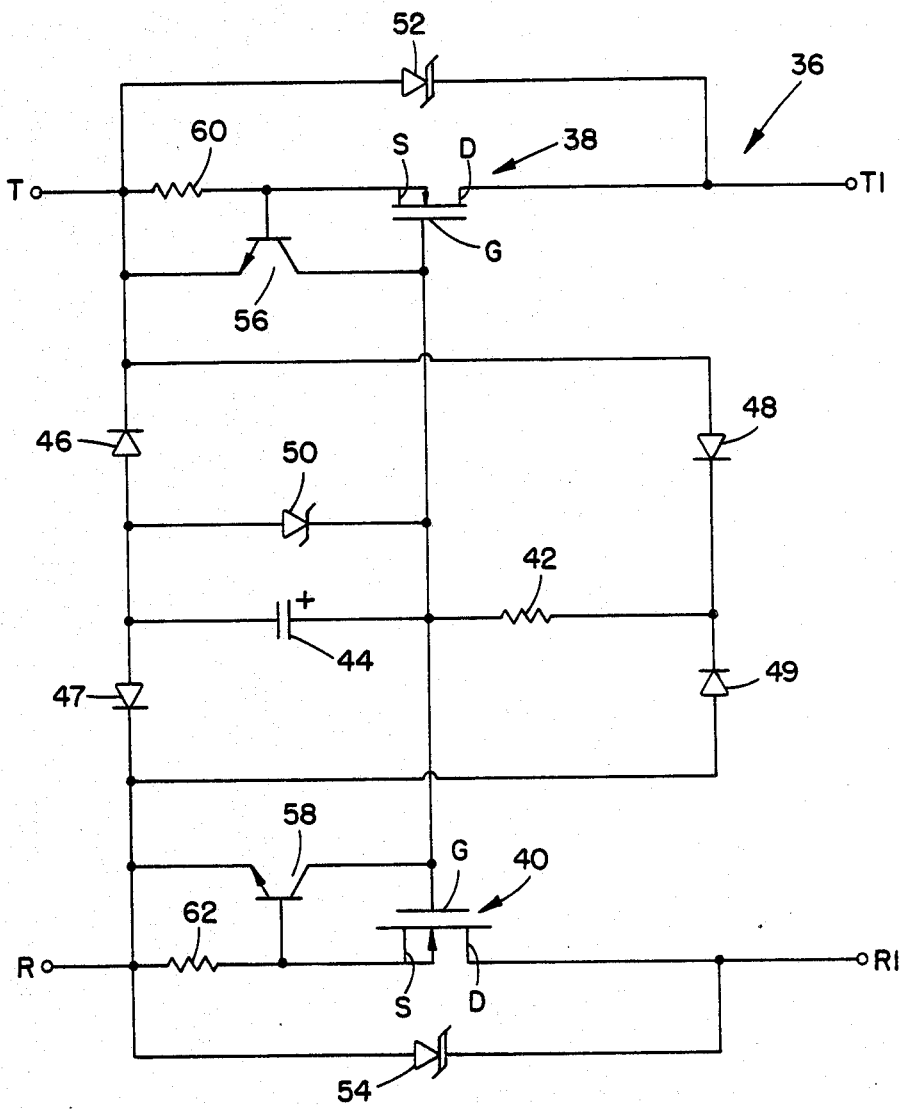
FIG. 5 is a schematic diagram of the switch of FIG. 3 including overcurrent protection.

The switch 36 may also include overcurrent protection as shown in FIG. 5. Transistors 56 and 58 are connected across the source and gate terminals of the FETs 38 and 40, respectively. Resistors 60 and 62 are connected in series with the source terminals of the FETs 38 and 40, respectively to provide the current limiting protection.

For example, with the terminal T positive, the zener 52 is forward biased so that all the current will flow through the zener 52 while the FET 40 will be turned on and all the current will flow to the terminal R through the resistor 62. If the current in the loop circuit exceeds a certain preset value chosen by the value of the resistor 62, so that the voltage drop across the resistor 62 exceeds the forward base bias turn-on voltage of transistor 58, the transistor 58 goes into conduction. The transistor 58 shorts the gate voltage of the FET 40 and bleeds off the charge across the gate of FET 40. This pinch-off of the charge across the gate momentarily turns off the FET 40, which lowers the flow of current through resistor 62, thus, turning off transistor 58 which in turn allows the charge across the gate to rebuild and turn the FET 40 on again. Thus, the closed loop current limiting and regulating circuit protects the FET 40 from overcurrents in the line. Similarly, for the opposite polarity of tip and ring, the same is true for transistor 56 together with the resistor 60 for protecting the FET 38.

The unilateral switch 36 shown in FIGS. 3, 4 and 5 may utilize either n-channel or p-channel field effect transistors. The Figures show the circuit utilizing n-channel FETs. If p-channel FETs are used, the polarity or types of all of the remaining components would be reversed.

Figure 6:
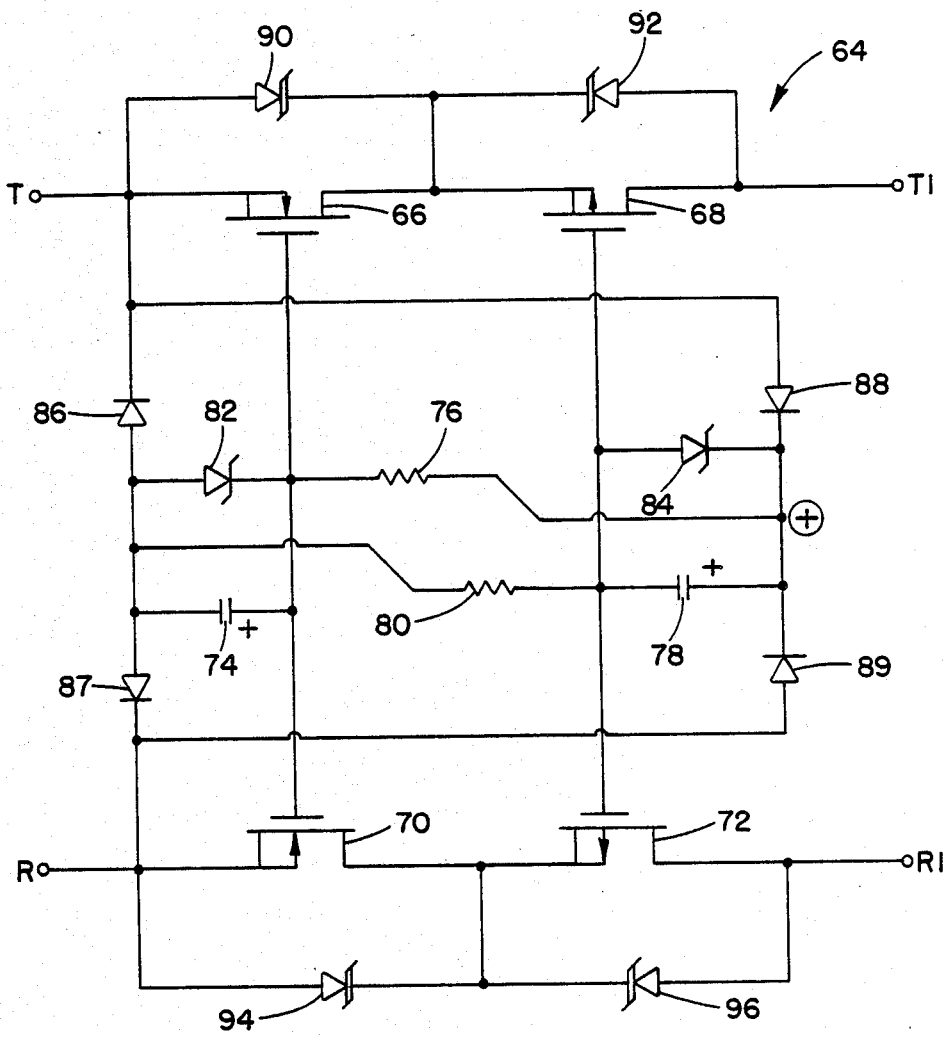
FIG. 6 is a schematic diagram of a bilateral solid state switch using FETs.

FIG. 6 shows a bilateral solid state switch 64 utilizing both n-channel and p-channel FETs. In the switch 64, a n-channel FET 66 and a p-channel FET 68 are connected in series with the tip line and a n-channel FET 70 and a p-channel FET 72 are connected in series with the ring line. A capacitor 74 and a resistor 76 render the FETs 70 or 66 conductive. A capacitor 78 and a resistor 80 render the FETs 72 or 68 conductive. Zener diodes 82 and 84 provide voltage limiting means for the capacitors 74 and 78, respectively. A diode bridge consisting of diodes 86, 87, 88 and 89 provides the proper polarity to charge capacitors 74 and 78. In addition, over voltage protection zener diodes or transient supressors 90, 92, 94 and 96 are connected across the source and drain terminals of FETs 66, 68, 70 and 72, respectively, in appropriate polarities.

The operation of the bilateral switch 64 is essentially the same as for switch 36. The capacitors 74 and 78 will turn on only the FET that is properly biased for each polarity. For example, with tip positive and ring negative, zener diode 90 will be forward biased and FET 68 will be in the on state. FET 68 being a p-channel FET, is turned on by the negative potential at its gate, which is referenced to the negative ring line R through the diode 88, resistor 80 and diode 87. The capacitor 78 is charged to the voltage across tip and ring, limited by the zener diode 84, with the bridge rectifier providing the negative to the gate of the FETs 68 and 72 regardless of the polarity of tip and ring. On the ring line, zener diode 96 will be forward biased and FET 70 will be in the on state. FET 70, being an n-channel FET, is turned on by the positive potential at its gate which is referenced to the positive tip line T through the diode 88 and resistor 76. The capacitor 74 is charged to the voltage across tip and ring limited by the the zener diode 82, with the bridge rectifier providing the positive potential to the gates of the FETs 70 and 68 regardless of the polarity of tip and ring. When ring is positive and tip negative, FET 66 will turn on due to the fact that its gate is more positive with respect to its source which is connected to the negative tip line. Similarly, FET 72 will turn on due to its gate being more negative with respect to its source which is connected to the positive ring line. In addition, zener diodes 92 and 94 will be forward biased.

As mentioned above, the FETs 66, 68, 70 and 72 may be turned off by a discharge mechanism that shorts the capacitors 74 and 78 removing the voltage potential at the gates of the FETs. In this embodiment, the four zener diodes 90, 92, 94 and 96 will be in the circuit and at least one zener will be normally blocking in each tip and ring line for a voltage below the avalanche voltage of the blocking zener. Thus, the subscriber is fully disconnected from the network side of the line for testing or other purposes.

Figure 7A:
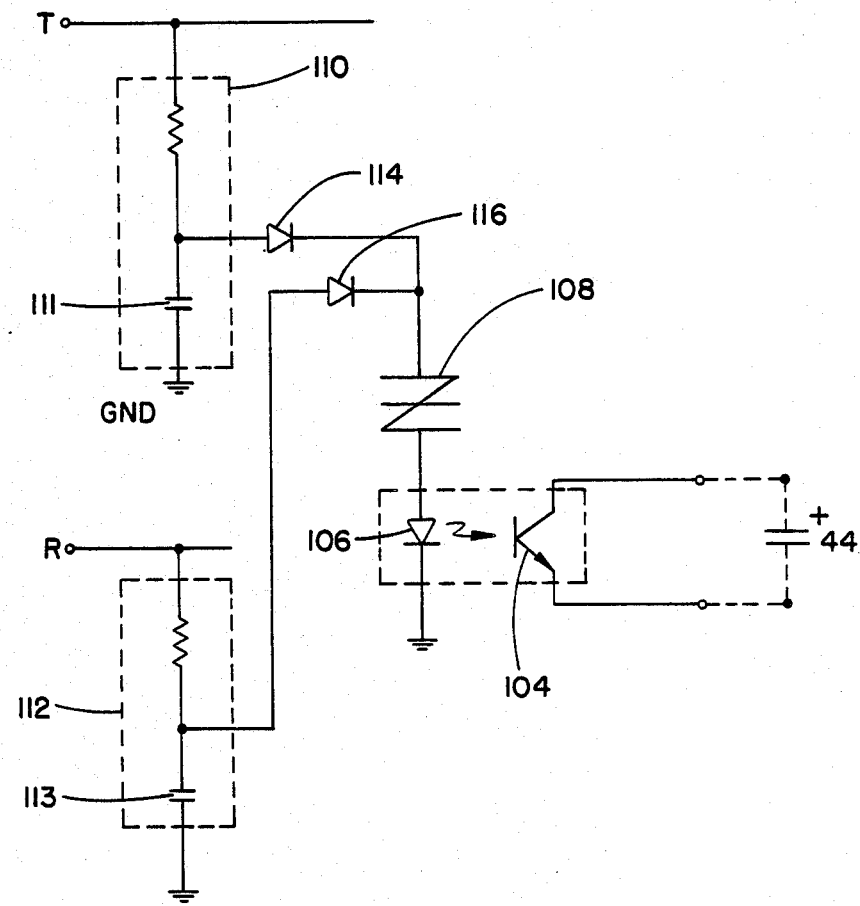
FIGS. 7a, 7b and 7c are schematic diagrams of a DC activated discharge mechanism.

One discharging mechanism for use with a DC disconnect device is shown in FIG. 7a which includes a photo-transistor 104 connected across the capacitor 44. The transistor 104 is responsive to a LED 106 which is connected to a sidac, SBS or SUS 108. The sidac 108 is connected to both the tip and ring lines through an RC networks 110 and 112, respectively, and through forward biased diodes 114 and 116, respectively. The RC networks 110 and 112 provide AC immunity to the disconnect circuit by not allowing sufficient time for the capacitors 111 or 113 to charge to the breakover voltage of the sidac 108 in response to the AC ringing voltage. The connection of the discharge mechanism of FIG. 7a with the remote switch forms a DC disconnect device that enables the central office to disconnect the subscriber with a DC voltage.

For example, when the central office intends to test the line, it applies 130 volts DC, also known as coin battery, on the tip and/or ring line with respect to ground. Only under this condition of 130 volts DC applied for 4 seconds across the tip and/or ring with respect to ground does the capacitor 111 or 113 charge up to over the 100 volt breakdown voltage of the sidac 108. In the event there is a fault condition where one of the lines is shorted to ground, the other line will permit its RC network 110 or 112 with its appropriate time constant to charge the capacitor to over 100 volts DC. The breakover voltage of the sidac 108 is set to be greater than the 100 volt test battery to prevent the disconnect circuit from being seen at the central office while testing the line with 100 volt test battery. The 100 volts DC conducted through one of the forward biased diodes 114 or 116, respectively, allows the sidac 108 to breakdown, which in its conduction mode has a fold back characteristic that allows the charged capacitor or both capacitors 111 and/or 113 to discharge into the LED 106. The LED 106, through the light emission, turns on the photo-transistor 104. The photo-transistor 104 may also be a photo-SCR or a photo-FET. Once the photo-transistor 104 is on, it then discharges the capacitor 44, which as previously described turns off the switch 36 or 64 accordingly for the time period it takes to charge up again. This charge time allows the central office test system to proceed to test the network side of the line without the customer equipment and its associated possible fault conditions connected to the line.

Figure 7B:
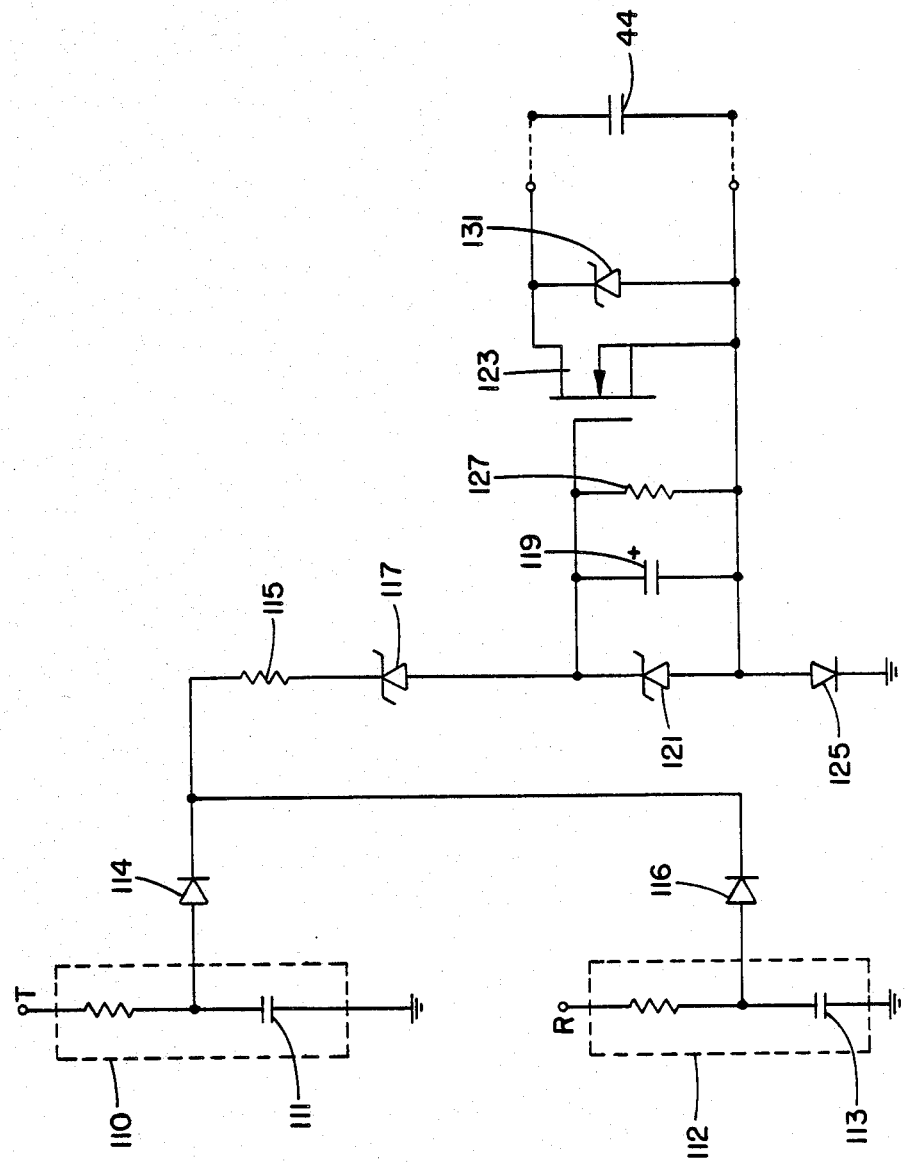

FIG. 7b is an alternative embodiment of the disconnect circuit shown in FIG. 7a. RC networks 110 and 112 provide the AC immunity and diodes 114 and 116 reference the voltage to the avalanche device 117. As described in FIG. 7a, the application of the 130 volt DC across tip and/or ring and ground will permit the capacitors 111 and 113 to charge to the breakover voltage of zener diode 117. When zener 117 avalanches, the voltage will begin to charge capacitor 119 to the voltage limited by zener diode 121 and the voltage divider formed with resistor 115. When capacitor 119 is charged, the voltage potential will be at the gate of FET 123 turning on FET 123 and placing the short across capacitor 44. Diode 125 provides the negative reference of the 130 volt coin battery to ground to permit the capacitor 119 to charge. When the coin battery voltage is removed, the capacitor 119 will discharge into resistor 127 and FET 123 will remain on for the time constant formed by capacitor 119 and resistor 127 maintaining the short across capacitor 44 for that time period. Zener diode 131 provides additional voltage protection to the FET 123.

Figure 7C:
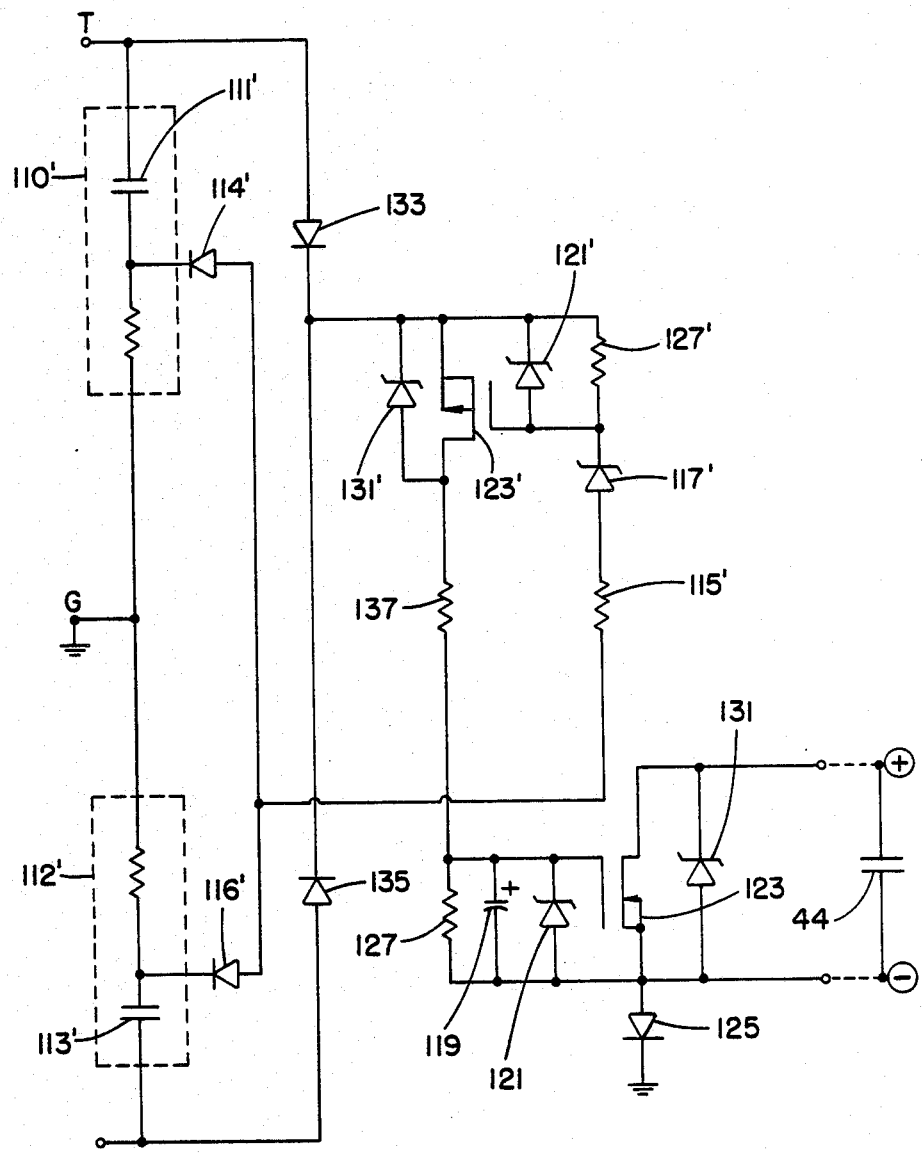

FIG. 7c is yet another embodiment of the DC disconnect circuit for shorting the capacitor 44. In the circuit of FIG. 7c the polarity of similar components shown in FIG. 7b has been reversed and therefore the components are designated with a prime. The RC networks 110' and 112' are connected with the capacitors 111' and 113' referenced to the tip and ring lines respectively. Diodes 114' and 116' provide the negative reference to ground for the p-channel FET 123' through resistor 115' and zener diode 117'. Similar to the operation of circuits of the FIGS. 7a and 7b, as the 130 volt coin battery DC voltage is applied, the capacitors 111' or 113' will charge to the breakover voltage of avalanche device 117' causing the device 117' to conduct and place the negative potential to the gate of p-channel FET 123' to turn FET 123' on. Once FET 123' is turned on, the entire coin battery voltage will be conducted through diodes 133 or 135 to the FET 123' and will be divided across the voltage divider formed by resistor 137 and resistor 127 to ground through the diode 125. The voltage across resistor 127 will be limited by the zener diode 121 thereby charging capacitor 119 to the zener 121 voltage to turn on FET 123. With the FET 123 turned on, capacitor 44 will be discharged. The coin battery is then removed and the FET 123 will remain on for the time constant of resistor 127 and capacitor 119.

Figure 8:
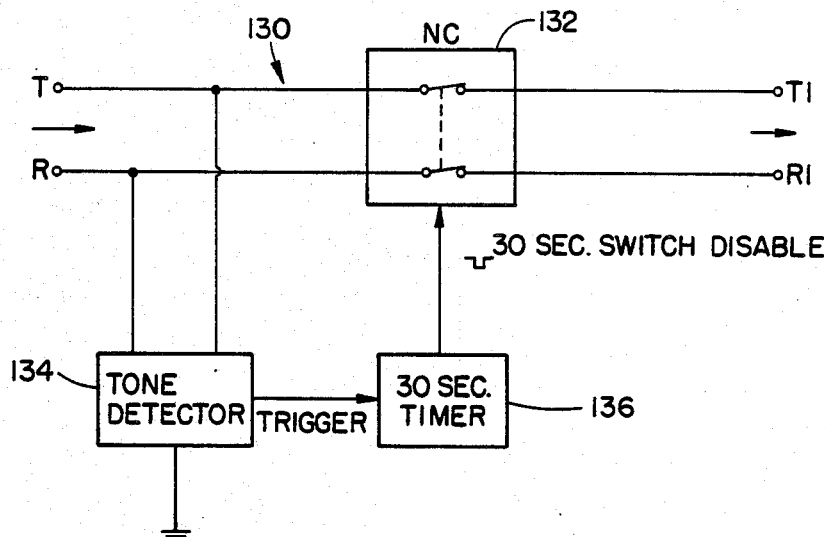
FIG. 8 is a block diagram of one embodiment of a tone activated remote disconnect device.

The solid state switches of the present invention may be utilized in various tone activated disconnect devices. FIG. 8 shows one embodiment of a tone activated remote disconnect device 130. The tone activated remote disconnect 130 includes a solid state remotely actuable switch 132 which is normally closed. The switching device 132 can be any of the unilateral or bilateral switches described above. A tone detector 134 is connected across the tip and ring lines of the telephone system. Timing means 136 is connected between the tone detector 134 and the switch 132 for opening the solid state switch 132 for a predetermined time period. The device is driven by the existing power in the telephone line.

In operation, the central office injects a given tone signal between the tip and ring lines and ground. Tone detector 132 sees this signal and activates the timing means 136 which opens the switch 132. At the end of the timing period, the switch 132 will automatically return to its normal position ready to be activated again at any given time. Thus, the central office can remotely disconnect the customer's line and test the circuit during the predetermined timing period. The device 130 saves the unwarranted dispatch of a loop technician to check the line.

Figure 8A:
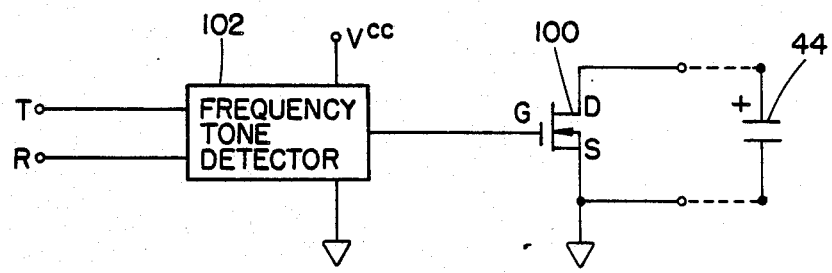
FIG. 8a is a schematic diagram of one embodiment of the discharge mechanism for a tone activated device.
Figure 8B:
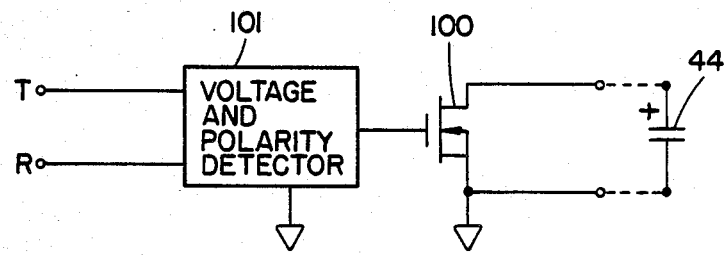
FIG. 8b is a schematic diagram of one embodiment of the discharge mechanism for a polarity activated device.

FIG. 8a shows discharge mechanism for use with a tone actuated disconnect device. The source and drain terminals of a FET 100 are connected across the capacitor 44 of the switch 36 and the gate is connected to a frequency detecting or decoding means 102. In this embodiment, the central office can activate and deactivate the switch 36 by sending a signal having a particular frequency that is decoded by the decoding means 102. The decoding means 102 will actuate the FET 100 which provides the momentary short across tip and ring to deactivate the switch 36. FIG. 8b shows the discharge mechanism including a voltage and polarity detector 101 which is actuated by polarity encoding imposed on the control signal from the central office.

The central office intending to disconnect the customer for testing the network side of the telephone line will send a specific signal which is then decoded by the decoding means 102 which is in standby under specific conditions. Having decoded the signal for a specific amount of time, typically 4 seconds, to insure that it was not a stray noise or signal, decoding means 102 will momentarily turn on FET 100 which instantaneously discharges capacitor 44. This immediately causes the FETs 38 or 40, "on" at that instant, to turn off. FETs 38 and 40 will stay off until the capacitor 44 is charged up to the specific gate turn-on voltage of the specific FET. The charge time is a function of the RC time constant of the resistor 42 and the capacitor 44, typically set to be 30 seconds, which is sufficient amount of time for the central office test equipment to fully test the network side of the line. A termination circuit may also be added to the network side or the customer side of the telephone line to enhance the interpretation of the test results.

Figure 9:
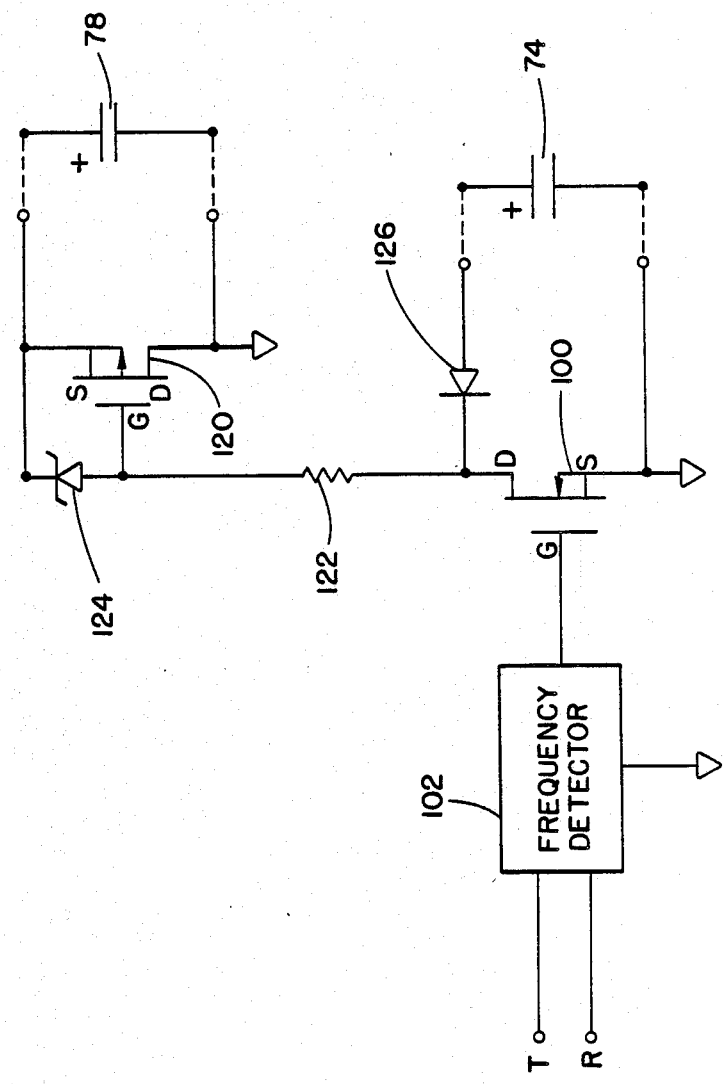
FIG. 9 is a schematic diagram of the discharge mechanism for the bilateral switch of FIG. 6 for a tone activated device.

FIG. 9 shows the discharge mechanism of FIGS. 7a and 7b adapted for use with the bilateral switch 64 illustrated in FIG. 6. FETs 100 and 120 are connected across capacitors 74 and 78, respectively. The drain terminal of FET 100 is connected to the gate of FET 120 through a resistor 122. A zener diode 124 provides gate protection for FET 120 while diode 126 prevents FET 120 from being turned on other than by FET 100. FET 100 is connected to the frequency decoding means 102 to discharge capacitors 74 and 78 in response to a particular frequency signal from the central office, similar to the operation described for FIGS. 8a and 8b.

In one embodiment, the decoding means 102 may be designed to decode two or more specific signals from the central office, and do different things according to the logic functions built into it. For example, upon receiving one signal, the decoding means 102 may turn on FET 100, thus, turning off switch 36 or 64 as per FIG. 6. It then will remain latched, or keep FET 100 on and therefore switch 36 or 64 off, until it receives yet another signal from the central office or under other built-in logic conditions to restore the line to normal conditions. Again, after the release of the FET 100, the usual RC time constant will continue to keep the switch 36 or 64 off.

Figure 10:
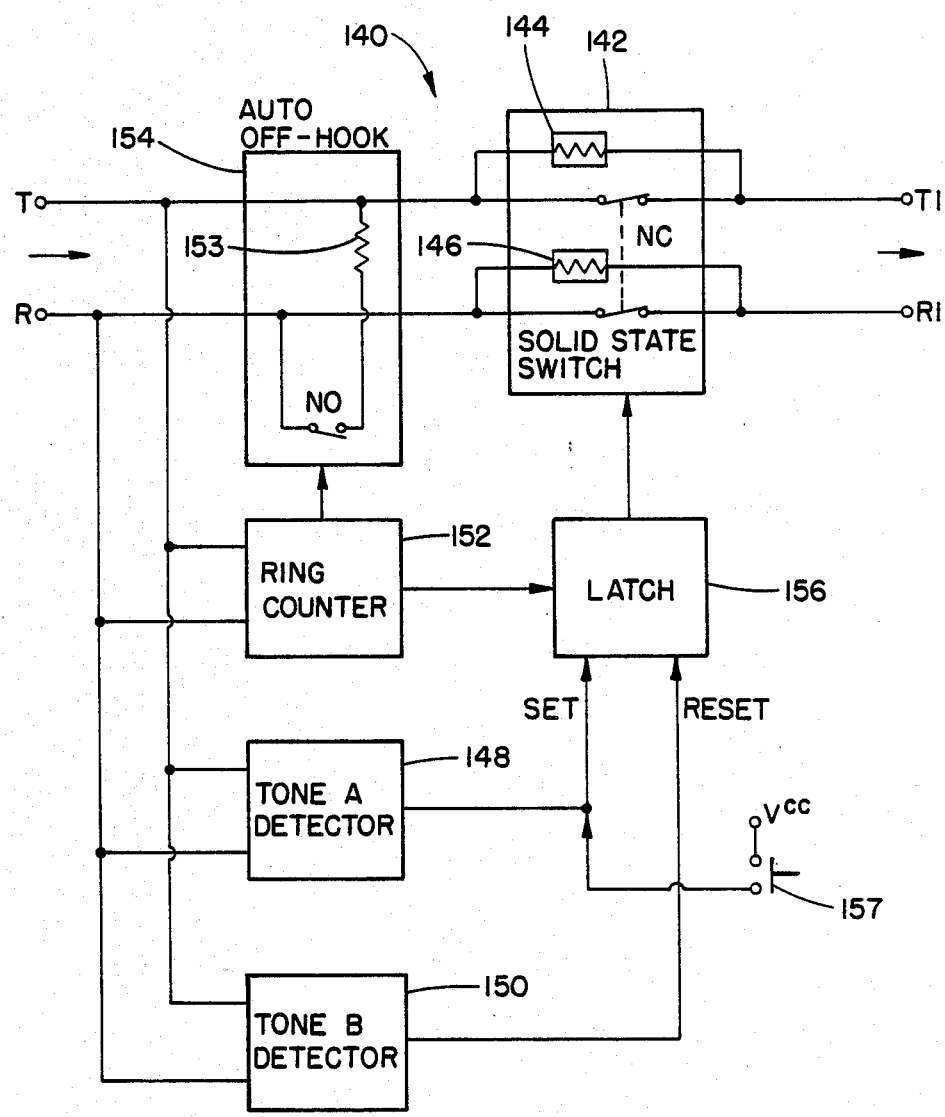
FIG. 10 is a block diagram of a non-payment tone activated disconnect providing call originate denial.

One embodiment as described above is shown in FIG. 10 which is a block diagram of a tone activated remote disconnect device for use by the central office for disconnecting a subscriber for non-payment. The non-payment line disconnect device 140 includes a solid state remotely actuable switching device 142 connected within the tip and ring lines. The device 142 can be any of the unilateral or bilateral switches disclosed above. Switching device 142 further includes means 144 and 146 connected across each switch in the tip and ring line for actuating the switches during ringing conditions even though the switches may be in an off state. In one illustrative embodiment, the means 142 and 146 include resistors of sufficient value to limit the loop current to the phone to prevent outgoing calls.

Tone detectors 148 and 150 are connected across the tip and ring lines and are designed to detect signals from the central office at different frequencies A and B. Also connected across the tip and ring line is a number of rings counter 152 and an automatic off-hook simulator 154. A latch means 156 is connected to the switching device 142 for opening the normally closed switches. The tone detector 148 is connected to the latch 156 for setting the latching means 156. The tone detector 150 is connected to the latch 156 for resetting the latching means 156. Also provided is manual set button 157 for locally setting the latch 156. The device is driven by the existing power in the telephone line.

In operation, upon the non-payment by the subscriber, the central office will call the telephone line number and if the party is not home, the preset number of rings set in the ring counter 152 will automatically trigger the off-hook simulator which places a resistor 153 across tip and ring producing a loop current to simulate the off-hook conditions. This provides a cut through to the telephone for remote location set and reset purposes. The telephone central office now injects a signal of a first predetermined frequency A which is decoded by the detector 148 which sets the latch 156 and opens the switch 142. The opening of these normally closed switches will prevent loop current from flowing when the phone is taken off-hook thereby denying the subscriber from originating calls. The means 144 and 146 are auxiliary remote actuating switches that close the switch 142 in response to the ringing voltage thereby enabling the subscriber to receive incoming calls. As mentioned above means 142 and 146 include resistors being of sufficient value to limit the loop current to the phone to prevent outgoing calls. Preferably, the resistors are valued at 11k ohms. Upon payment of the delinquent bill, the central office will call the appropriate line number and when the party goes off-hook a signal of a second frequency B that is decoded by the tone detector 150 is sent down the line to reset the latch and close the switches 142. Similarly as above, if the party is not home, the ring counter and the off-hook simulator will activate to permit the latching means to be reset.

Figure 11:
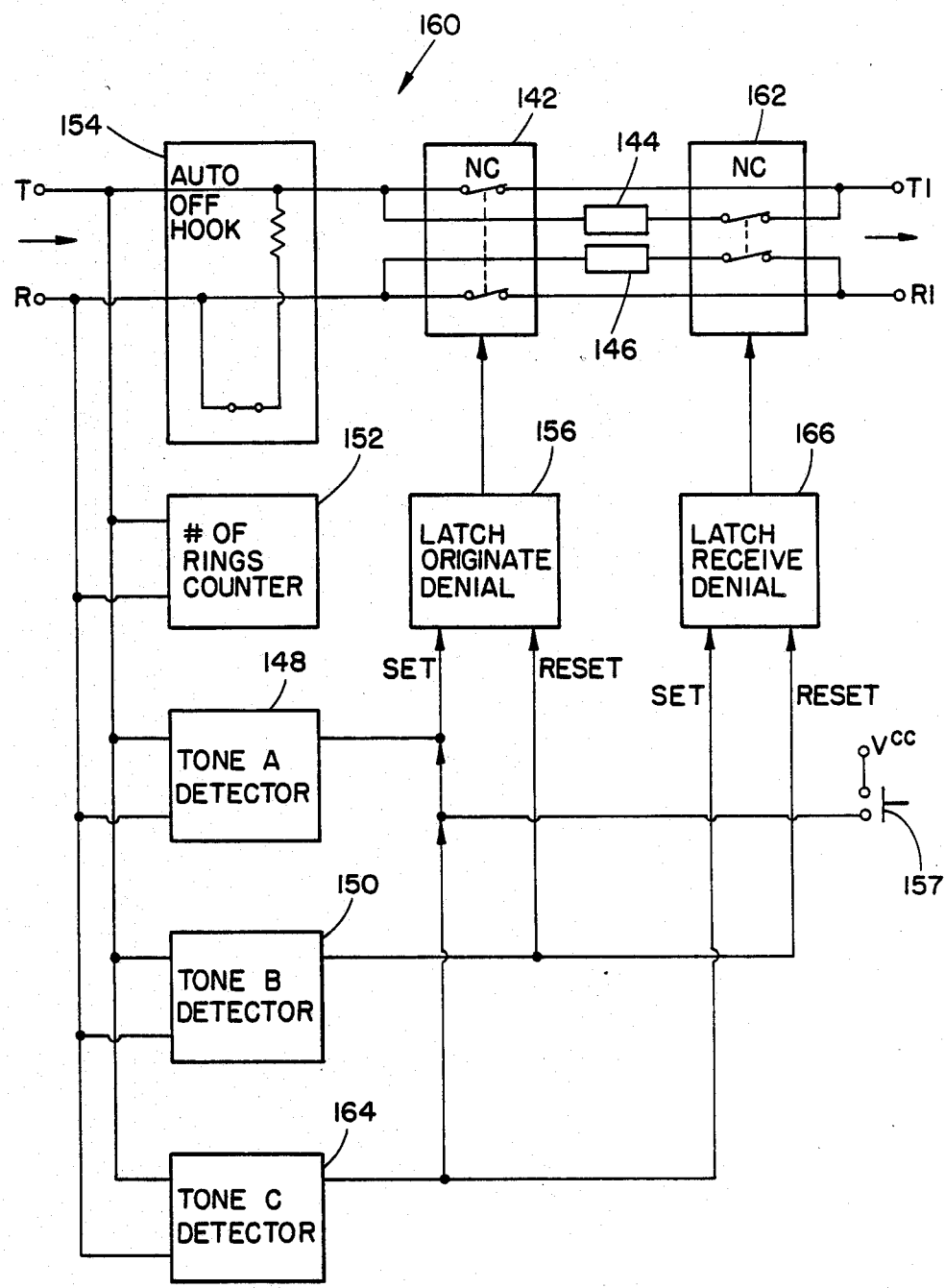
FIG. 11 is a block diagram of a tone activated remote disconnect providing total service denial.

FIG. 11 shows a modified non-payment line disconnect device for providing both call originate and total service denial. Device 160 includes an additional solid state switching device 162, an additional tone detector 164 and a second latching means 166. The tone detector 148 sets the latch 156 to open the switch 142 to provide call originate denial as with the device 140. The tone detector 164 sets the latch 166 to open switches 162 which disconnects the ring enable means 144 and 146 to provide total service denial. The switches 162 are connected in series with the means 144 and 146 to provide the full service denial. The tone detector 150 resets both latches 156 and 166 to restore the line to full service.

Figure 12:
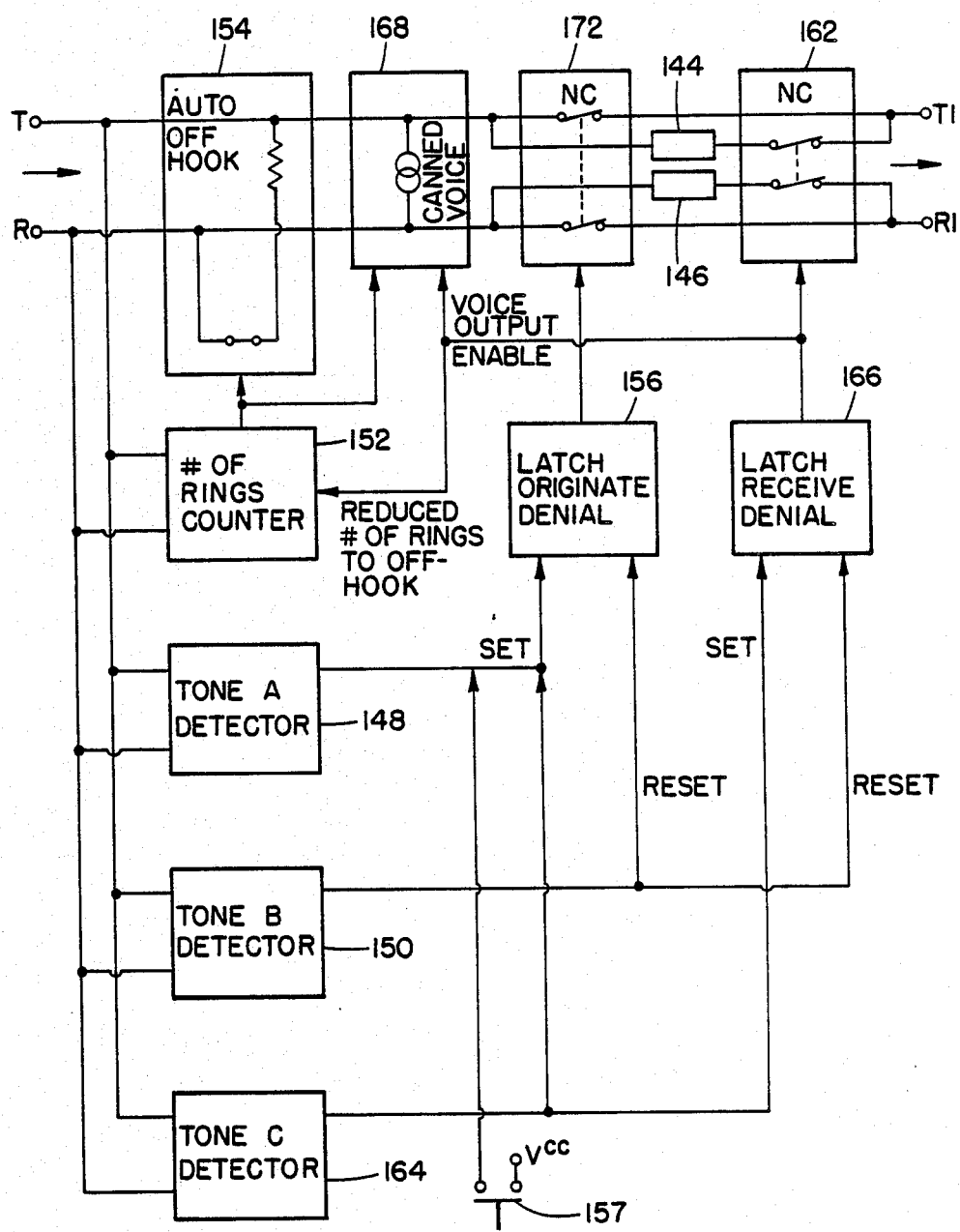
FIG. 12 is a block diagram of the tone activated remote disconnect of FIG. 12 including a voice message means.

FIG. 12 shows a device 160 including a canned voice means 168 across the tip and ring line that is activated by the latch 166. The device 168 is a stored message synthesizer which upon the setting of the latch 166 will activate, together with automatic off-hook simulator 154, to provide a message to the caller such as "this line has been temporarily disconnected."

Figure 13:
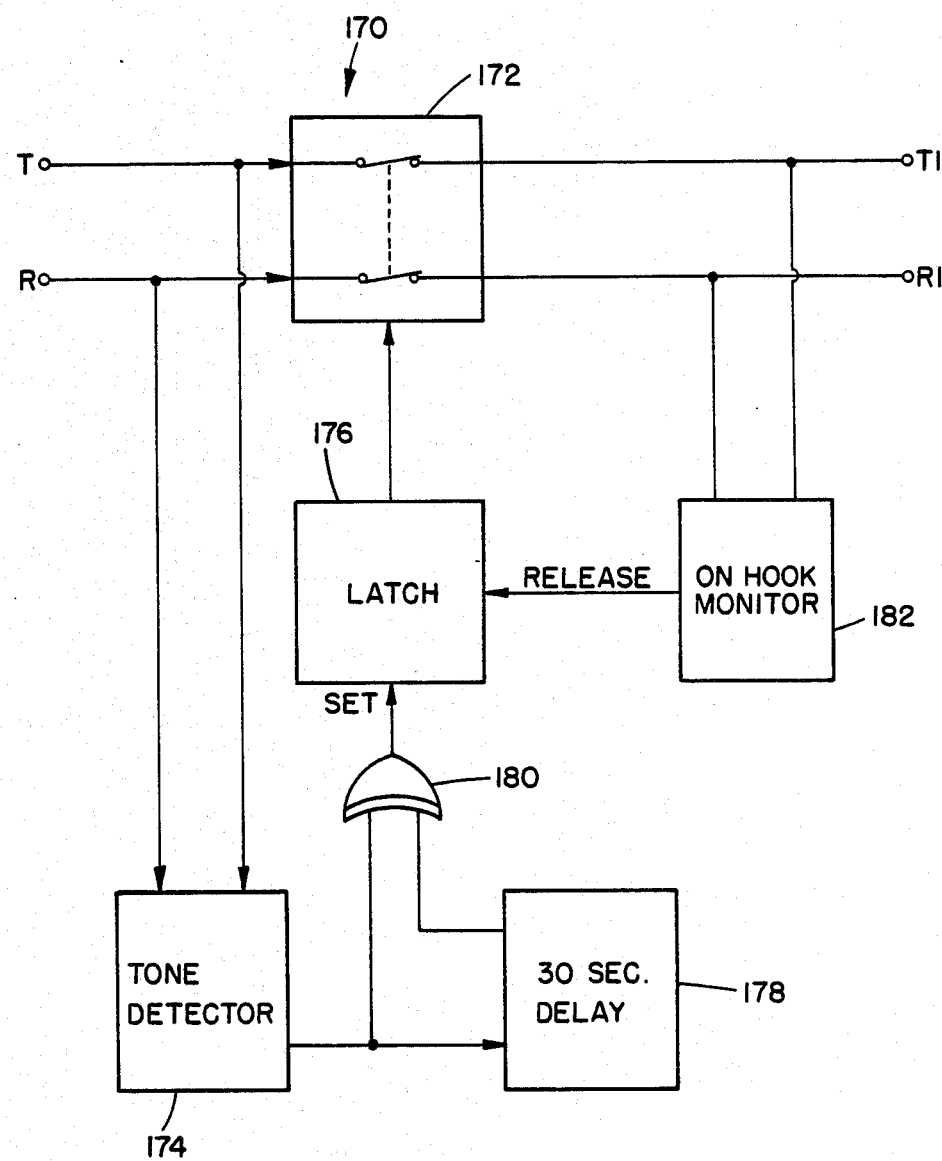
FIG. 13 is a block diagram of an automatic permanent release device.

Another use of the remote actuable switches of the present invention is shown in FIG. 13 for automatically releasing a permanent condition that may exist on the telephone line. The permanent condition may be caused by a subscriber inadvertently or purposely leaving his phone off-hook or by a coin being stuck in a pay station. This permanent condition may tie up a multiextension or a multiparty line or may tie up the central office equipment.

The automatic permanent release device 170 includes a remotely actuable switch device 172 connected within the tip and ring lines. A tone detector 174 is connected across the tip and ring lines responsive to the permanent tone signal generated from the central office in response to the receiver off-hook condition. A latching means 176 opens the normally closed switches 172. The latch 176 is set only after a delay of a predetermined time provided by a delay circuit 178. The output of the tone detector 174 provides a low to the exclusive OR gate 180. After the delay time set by the circuit 178, if the condition is not restored or if the phone is not put back on hook, the delay circuit 178 also provides a low to the exclusive OR gate 180 which will set the latch 176 to open the switches 172 and free the line of the permanent condition. As soon as the switches 172 are open, the off-hook tone is removed and the central office sees the line as if the receiver has been restored to the on-hook condition. An on-hook monitor 182 senses when the phone has been placed back on the hook and automatically releases the latch to close the switches 172. The latch release may have a built in delay circuit to prevent the latch from being released by a sudden transient condition on the line. Power to the circuit is provided by telephone lines. Thus, no external power source is needed, and the circuit is powered only with the subscriber's phone in the off-hook condition.

Figure 14:
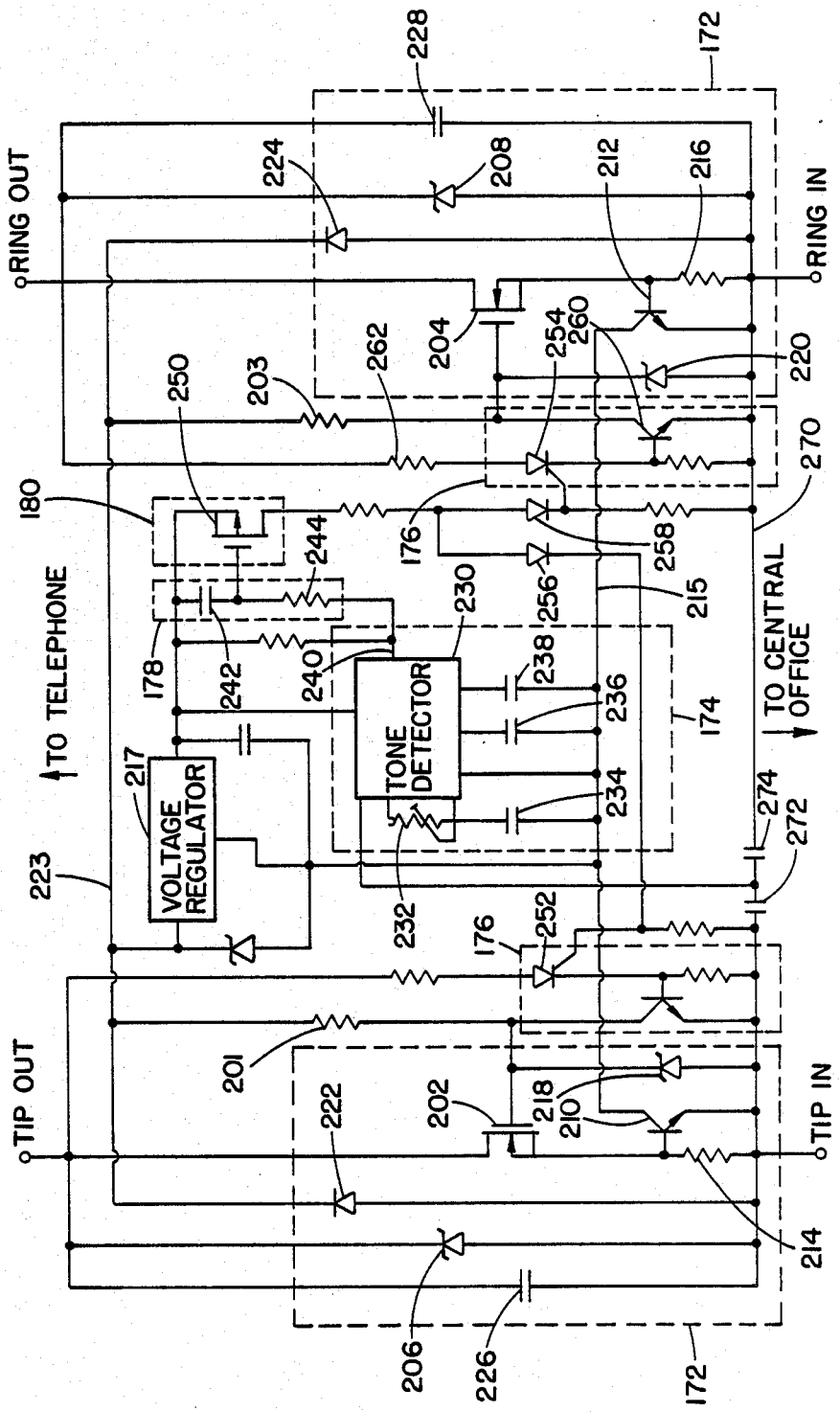
FIG. 14 is a schematic diagram of an automatic permanent release device.

FIG. 14 is a schematic diagram embodying the apparatus shown in FIG. 13. The switches 172 include FETs 202 and 204 connected within the tip and ring lines respectively. The FETs include protective zener diodes 206 and 208 respectively. In this embodiment, the base of each FET is protected by its own individual zener diode 218 and 220. Diode 222 and 224 provide the positive potential to the positive rail 223 for normally energizing the FETs 202 and 204 through the resistors 201 and 203 respectively. Furthermore, capacitors 226 and 228 provide surge protection by slowing the rate the voltage is applied to the FETs 202 and 204.

The tone decoder 174 includes an IC tone decoder 230 which is tuned to the permanent tone sent by the particular central office. The tone decoder 230 is powered by a voltage enabled by switches 210 and 212 as regulated by voltage regulator 217. For example, with tip positive, and the phone in an off-hook condition, current will flow through zener 206 to the phone, through FET 204 and resistor 216 back to ring. The voltage drop across resistor 216 will forward bias switch 212 to turn switch 212 on, thus connecting the negative potential to the minus rail 215. Thus, the voltage regulator 217 and the tone decoder 230 are referenced to the negative rail 215. The decoder circuit 174 includes a potentiometer 232 and capacitors 234, 236 and 238. The potentiometer 232 permits the tone decoder to be set to the reference frequency. Capacitors 234, 236 and 238 provide the percentage deviation of the incoming tone from the selected frequency that will provide an output on terminal 240.

Time delay circuit 178 includes capacitor 242 and resistor 244 forming a time constant that provides a delay in the application of the output from tone decoder 230. The delay circuit 178 prevents a spike from accidentally actuating the circuit. The time delay also permits the customer time to return the phone on hook before actuation of the device. The OR gate 180 includes the FET switch 250 which sets the latching circuits 176. Each FET 202 and 204 has a individual latch circuit 176 including latching switches 252 and 254 such as SCRs. The SCRs 252 and 254 are triggered by steering diodes 256 and 258 respectively.

In operation, with the receiver left off hook after the termination of a call or for a period longer than 20 seconds the central office will send a tone that is detected by the tone detector 230 through capacitors 272 and 274. The capacitors 272 and 274 form an AC voltage divider for the tone detector 230. Therefore, there is no need for a transformer to couple the AC input to the DC circuit. The voltage regulator 217 regulates the voltage across tip and ring in the off-hook state, to a fixed voltage for the tone decoder 230. If the tone is within the capture frequency range of the decoder 240, an output is produced on line 240 which turns on the FET 250. The FET 250 then triggers the latching switches 252 or 254 through steering diodes 256 or 258. If tip is positive, then latching switch 254 will turn on and the entire circuit on the right hand side of FIG. 16 will be operative. With tip positive, the circuit containing FET 204 will be operative while the circuit containing FET 202 will be dormant. With latching switch 254 turned on, biasing current will be provided to the base of transistor 260 turning transistor 260 on. Transistor 260 shorts the gate of FET 204 and turns FET 204 off so that there is no flow of current through the telephone. The lack of current flow to the central office mimicks a condition where the receiver is on hook. However, since the receiver is actually off hook, there is a small current flowing through resistor 262 that continues to flow through latching switch 254 and transistor 260 back to the Ring in terminal as long as the receiver is off hook. This will continue to keep FET 204 in an off state. This miniscule current is not sufficient to indicate to the central office that an off hook condition exists.

When transistor 260 is on, the gate of the FET 204 is connected to the rail 270 of the circuit which is equivalent to placing a short circuit to the gate. Therefore, there will be no further flow of current through the transistor 212 so that there will be no current supplied to the tone decoder 174.

The lack of current flow to the central office indicates that the receiver has been placed back on hook. The central office then reapplies the talk battery so that the line can now be used for incoming calls and for outgoing calls from other extentions. The talk battery voltage does not turn on the FET 204 due to the latching switch 254 sustaining the FET 204 off.

After the phone is actually replaced back on hook, the flow of current through resistor 262 is interrupted, shutting off latching switch 254 and transistor 260, allowing the FET 204 to again be turned on by the talk battery voltage.

Figure 15:
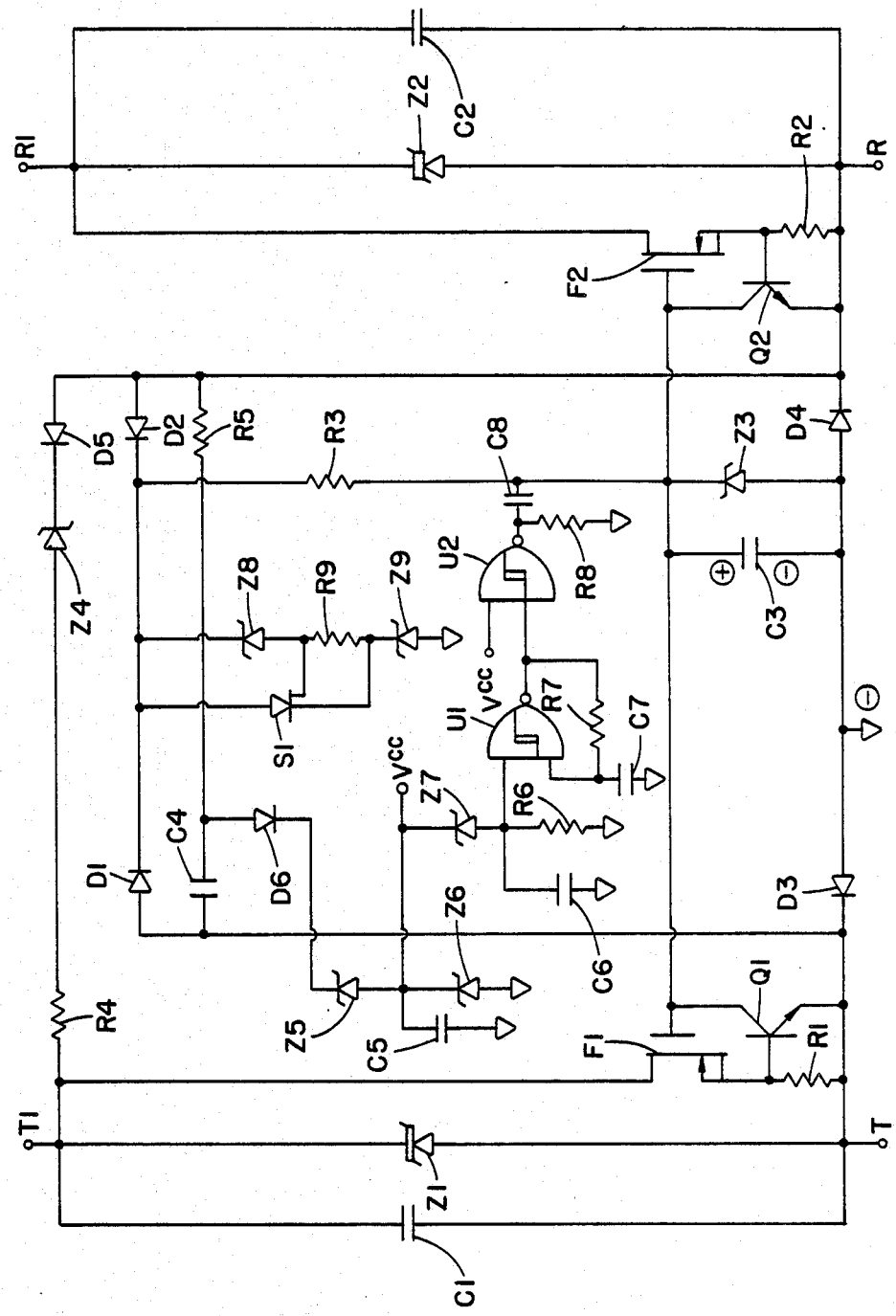
FIG. 15 is a schematic diagram of an MTU device including FET switches.

FIG. 15 is a schematic diagram wherein the FET switch shown in FIG. 5 is utilized as an MTU. It should be noted that the symbol of the triangle pointing toward the bottom of FIG. 10 in several places indicates a common potential of zero volts. The FET switch includes the field effect transistors F1 and F2. Shown in this application are n-Channel FETs which in actual practice may be replaced by p-Channel FETs, or by a bilateral solid-state switch configuration having an n and p Channel FET connected in each tip and ring line, as described in FIG. 6. A resistor R3 and a capacitor C3 forms an RC time constant circuit for normally energizing the FETs F1 and F2. The voltage across tip and ring is fed through the resistor R3 and charges the capacitor C3 to energize the FETs F1 and F2. The capacitor C3 sustains the FETs F1 and F2 on for the time the capacitor C3 remains charged. Thus, during normal talk battery conditions, FET F1 or F2 will be on.

The FET switch further includes the diodes D1, D2, D3, and D4 forming a bridge circuit which rectifies the voltage available across the tip and ring telephone line, and feeds the positive potential through the resistor R3 to the capacitor C3 connected to the gates of the FETs F1 and F2. The bridge insures that the capacitor C3 is charged to the proper polarity with the positive end being connected to the gates of the FETs F1 and F2. The negative end of the capacitor C3 is connected to the negative end of the bridge circuit. A zener diode Z3 limits the voltage build across the capacitor C3 and consequently across the gates of the FETs. Transistor Q1 together with resistor R1 and transistor Q2 together with resistor R2 form an overcurrent production means 34 and protect FETs F1 and F2 respectively from overcurrent. SCR S1 together with zeners Z8 and Z9 and resistor R9 form the basis of an overvoltage protection means for the entire circuit.

A voltage monitor includes a diode D6 and zeners diodes Z5 and Z6 which detects the presence of the test voltage on the line. A resistor R5 limits the current and together with capacitor C4 provides the AC voltage and noise immunity to the voltage monitor circuit.

An oscillator circuit includes Schmitt Trigger Nand gates U1 and U2 as provided by standard C-MOS IC circuits. U1 and U2 together with the affiliated components zener diode Z7, capacitors C6, C7, and resistors R6, R7 form the oscillator, while capacitor C8 and resistor R8 form the interface between the oscillator and the FET switches F1 and F2. Diode D5 is a polarizing diode and together with zener diode Z4 and resistor R4 form a termination circuit for the MTU.

In operation, the switches F1 and F2 will be energized by the resistance-capacitance time constant circuit R3, C3, depending on the polarity of the voltage across tip and ring. If the tip terminal T is positive, F2 will be turned on by the voltage across the capacitor C3 and if the ring terminal R is positive F1 will be turned on the voltage across the capacitor C3. Protective elements zeners Z1 and Z2, provide a path for the flow of the loop current in the line that is positive in addition to protecting the FETs from overvoltage. Thus, if terminal T is positive, zener Z1 carries the current to terminal T1, and the return current from the telephone or station set arriving at terminal R1 flows through switch F2 and resistor R2 and back to the central office through terminal R. Similarly, for terminal R positive, the current flows through zener Z2 and switch F1 and resistor R1 and back to terminal T. Capacitor C1 provides protection from transient voltage and minimizes insertion loss.

If tip is positive, the current returns through switch F2 and resistor R2. If this current is such that the voltage drop across the resistor R2 exceeds the base emitter junction voltage of the transistor Q2, the transistor Q2 turns on and shorts the gate voltage of the FET F2, turning FET F2 off, which reduces the flow of current through resistor R2. Consequently, the reduced base emitter voltage turns off transistor Q2 which then permits switch F2 to turn on again. In a continuous loop this provides current regulation through the loop, thus protecting all components in the loop from an overcurrent condition. Similarly, switch F1, resistor R1, and transistor Q1 protect the circuit from overcurrents when ring is positive.

SCR S1 provides overvoltage protection across tip and ring. The voltage across tip and ring is applied across zener Z8, resistor R9 and zener Z9. As the voltage exceeds that of zeners Z8 and Z9 together, SCR S1 is triggered by the build up of voltage greater than the gate trigger voltage across the resistor R9. The SCR S1 is triggered and bypasses such time, capacitor C6 and resistor R6 keep one input of the Schmitt trigger NAND gate U1 at a low level. The other input of this gate U1 is within the feedback loop formed by resistor R7 and capacitor C7. This forms an oscillator the preferred frequency of which is set at 3Hz.

NAND gate U1 drives NAND gate U2 which is used as an output driver. NAND gate U2 is coupled to the solid state switches F1 and F2 through capacitor C8 and resistor R8. In the absence of adequate supply voltage for NAND gates U1 and U2, capacitor C8 is maintained at a steady low through resistor R8. Thus, in normal talk, on-hook and ring modes the oscillator is dormant when the output of NAND gate U2 starts to oscillate driven by gate U1, capacitor C8 will push-pull capacitor C3 thereby turning the FET, F1 or F2, on and off cyclically at a 3Hz rate. If the output of Nand gate U2 is low, capacitor C8 begins to charge from resistor R3 and capacitor C3, which puts a momentary short across capacitor C3 shorting the gates of the FETs F1 and F2. When the output of gate U2 is high, both sides of capacitor C8 are at a positive potential, shorting capacitor C8 and allowing the capacitor C3 to again be charged by the line voltage.

Each time FETs F1 or F2 are on, all the impedances in the telephone loop are visible to the central office test and measurement system, while when F1 and F2 are off, only the impedances on the network side are visible, thus providing the valuable information on the loop condition.

In the absence of any fault conditions on the loop, the central office test vehicle would be at a loss to know if any fault locating device is on the line. Thus, the termination circuit formed by the steering diode D5 the zener Z4 and resistor R4 are also added to the circuit. The impedance of the termination circuit is fixed and known and is recognized by the central office test and measurement system as a signature. The turning on and off of the switches F1 and F2 further produces the turning on and off of the termination circuit providing a wiggle of the signature at the central office which provides an added verification that the fault locating device is in circuit.

While illustrative embodiments of the subject invention have been described and illustrated, it is obvious that various changes and modifications can be made therein without departing from the spirit of the present invention which should be limited only by the scope of the appended claims.

What is claimed is:

1. A remotely actuable switch for use in testing a remote circuit normally carrying both alternating and direct current, said switch comprising:
    at least one solid state bilateral switch having a first and a second terminal connected in series with said remote circuit and a gate for rendering the switch conductive between said terminals in response to a first predetermined current level;
    a solid state avalanche device for each bilateral switch connected between the gate and the second terminal of the bilateral switch, said avalanche device responsive to a first predetermined test voltage to render said solid state switch conductive, said solid state switch being nonconductive below said test voltage;
    a means for suppressing voltage transients beyond a second predetermined level connected across the first and second terminals of the bilateral switch;
    whereby said switch is normally transparent to and conductive for both alternating and direct currents normally encountered in said circuit at said remote locations, but may be selectively rendered conductive or nonconductive for test purposes by the application of a test voltage above or below said first predetermined voltage.

2. A remotely actuable switch for use in a remote telephone tip and ring circuit, said switch being actuated by predetermined combinations of circuit currents and voltages, said switch being normally transparent to and conductive for both alternating and direct circuit currents normally encountered in said telephone circuit at said remote location, said switch comprising:
    at least one solid state bilateral switch having a first and a second terminal connected in series with said remote telephone circuit, said bilateral switch having a gate responsive to a gate trigger current level to initiate conduction, and responsive to a switch hold current level to sustain conduction;
    a solid state avalanche device for each bilateral switch connected between the gate and the second terminal of the bilateral switch to render the bilateral switch voltage sensitive, said avalanche device being responsive to a predetermined threshold voltage level to render said bilateral switch conductive when said circuit current level exceeds said gate trigger current level;
    said bilateral switch being rendered non-conductive by dropping said circuit current level below said switch hold current level, and rendered conductive only by the application of a voltage above the predetermined threshold voltage level;
    whereby the switch at the remote location may be rendered nonconductive to selectivity test the circuit to the remote location with voltages below said threshold voltage.

3. The remotely actuable switch of claim 1 or 2 wherein said solid state bilateral switch is a triac.

4. The remotely actuable switch of claim 1 or 2 wherein said avalanche device is a diac.

5. The remotely actuable switch of claim 1 or 2 further including a resistor connected in series with said avalanche device for limiting the amount of current flow to the gate of said bilateral switch.

6. The remotely actuable switch of claim 1 or 2 wherein said avalanche device includes two zener diodes connected back to back.

7. The remotely actuable switch of claim 2 further including a means for suppressing voltage transients beyond a second predetermined level connected across the first and second terminals of the bilateral switch.

8. The remotely actuable switch of claim 7 wherein said means for suppressing voltage transients includes a resistor and capacitor connected in series across the first and second terminals of said solid state bilateral switch.

9. The remotely actuable switch of claim 8 wherein said bilateral switch includes:
    two unilateral solid state switches having an anode and cathode terminal connected series with said remote circuit, each of said unilateral switches being connected in parallel and in the opposite polarity, each of said unilateral switches having a gate responsive to a gate trigger current level to initiate conduction, and responsive to the switch hold current level to sustain conduction; and
    said solid state avalanche device includes a diode means for each unilateral switch connected between the gate and the anode of said unilateral switch to render the unilateral switch voltage sensitive, each of said diode means being responsive to a predetermined voltage level to render the respective unilateral switch conductive when said circuit current level exceeds the gate trigger current level.

10. The remotely actuable switch of claim 9 further including diode means connected in series with each said avalanche device poled to block conduction between the gate and the anode of each said unilateral switch.

11. The remotely actuable switch of claim 8 wherein said bilateral switch includes:
    a solid state unilateral switch having an anode and a cathode connected in series with said remote circuit, and a gate responsive to a gate trigger current level to initiate conduction, and responsive to a switch hold current level to sustain conduction;
    a diode bridge circuit connected in series with said remote circuit for providing the proper polarity to said solid state unilateral switch regardless of the polarity of the remote circuit; and
    said solid state avalanche device includes a diode means connected between the gate and the anode of the unilateral switch to render the unilateral switch voltage sensitive, said diode means being responsive to a predetermined threshold voltage level to render said unilateral switch conductive when said circuit current level exceeds said gate trigger current level.

12. A remotely actuable switch for use in a telephone tip and ring circuit, said remote switch providing a remote subscriber switching means responsive to a control signal from a telephone central office, said switch comprising:
    at least one field effect transistor in said subscriber tip and ring circuit, said FET being in series with its respective switched circuit,
    a resistance-capacitance, time-constant circuit for normally energizing said FET and rendering said switch conductive, a circuit means for discharging said resistance-capacitance circuit in response to a control signal from the central telephone office, whereby said FET(s) may be rendered nonconductive by the discharge of said capacitor in said resistance-capacitance circuit in response to a remote control signal from the telephone central office.

13. The remotely actuable switch of claim 12 wherein each of said FETs include source, gate and drain terminals, said source and drain terminals being connected in series with its respective tip and ring circuit and said gate terminals being connected together.

14. The remotely actuable switch of claim 13 further including a diode bridge connected across the tip and ring circuit for providing the proper polarity for energizing said FETs regardless of the polarity of the voltage across tip and ring.

15. The remotely actuable switch of claim 14 further including an avalanche device connected across the gate and source terminals of each FET.

16. A remotely actuable switch for use in a telephone tip and ring circuit, said remote switch providing a remote disconnect means for a telephone subscriber in response to a control signal or to line conditions from the telephone central office, said switch comprising:
at least one field effect transistor in each tip and ring circuit, the source and drain terminals of each of said FETs being connected in series with the respective tip and ring circuit, and the gates of each FET being connected together;
an avalanche device for each FET connected across the source and drain terminals of the respective FET, each of said avalanche devices being poled to normally conduct from the central office to the subscriber;
a resistance-capacitance, time constant circuit for normally energizing said FETs and rendering said FETs conductive in response to a voltage across the tip and ring circuit;
a diode bridge circuit connected across the tip and ring circuit for providing the proper polarity for energizing said FETs regardless of the polarity of the voltage across the tip and ring circuit; and
an avalanche device connected across the capacitor in said resistance-capacitance circuit for limiting the voltage supplied to said FETs;
whereby said FETs are rendered nonconductive by the discharge of said capacitor in said resistance-capacitance circuit, and said FETs being sustained nonconductive for the time period equal to the time constant of said resistance-capacitance circuit.

17. The remotely actuable switch of claim 12 wherein said circuit means for discharging said resistance-capacitive circuit includes a unilateral switch connected across a capacitor which is actuated by said remote control signal from the central office.

18. The remotely actuable switch of claim 17 wherein said unilateral switch is a field effect transistor.

19. The remotely actuable switch of claim 12 wherein said circuit means for discharging said resistance-capacitive circuit further includes a bilateral switch connected to said tip and ring circuits for actuating a unilateral switch in response to the control signal from the central office.

20. The remotely actuable switch of claims 12 or 16 further comprising overcurrent protection means for each FET.

21. The remotely actuable switch of claim 20 wherein said overcurrent protection means for each FET includes a transistor and resistor circuit connected between the gate and source terminals of each FET.

22. The remotely actuable switch of claim 16 including:
first and second n-channel field effect transistors having drain and source terminals connected in series with each said tip and ring circuits respectively, and gate terminals connected together;
first and second p-channel field effect transistors having drain and source terminals connected in series with each said tip and ring circuits respectively, and gate terminals connected together;
a resistance capacitance, time constant circuit for each pair of n-channel FETs and p-channel FETs for normally energizing said FETs and rendering them conductive;
a circuit means for each pair of n-channel and p-channel FETs for discharging the capacitor in each of the said resistance-capacitance circuits in response to a control signal from the central telephone office;
whereby said FETs are rendered nonconductive by the discharge of said capacitor in said resistance-capacitance circuits.

23. A polarity sensitive switch for connection within a telephone tip and ring circuit, said switch responsive to line conditions from a central office, said switch comprising:
a switching circuit in at least one of the tip and ring circuits, each of said switching circuits including a field effect transistor in its respective tip and ring circuit;
at least one resistance-capacitance, time-constant circuit within a bridge circuit for normally energizing said FET and rendering it conductive;
a voltage and polarity detector means connected across said tip and ring circuits, said voltage and polarity detector means generating an output in response to line conditions originating from said central office; and
at least one circuit means for discharging said capacitor in the resistance-capacitance circuit in response to an output signal from said voltage and polarity detector means;
whereby said FETs are rendered nonconductive by the discharge of said capacitor in said resistance-capacitance circuit.

24. A plurality of remotely actuable switches of claim 2 connected within a multi-subscriber set telephone system wherein:
at least one of said remotely actuable switches being connected in series with each subscriber set, each of said remotely actuable switches having a total threshold greater than the normal maximum voltage available across tip and ring in the off-hook condition,
whereby when one subscriber set is in an off-hook condition, the voltages and impedances in the subscriber loop reduces the voltage across the tip and ring lines below said threshold voltage, so that none of the other remotely actuable switches in series with the other subscriber sets not in use are able to bridge into the circuit due to the lack of said threshold voltage on the line, said threshold voltage being available immediately after the subscriber set first holding the line, releases the line, thus permitting the set waiting to get on line to seize the line without loss of connection to the party at the other end of the line.

25. A tone activated remote disconnect device for connection within the tip and ring lines connecting a central office to a subscriber of a telephone system, said disconnect device comprising:
a first switching device having at least one remotely actuable solid state switch device connected in series with said tip and ring lines;
a first tone detector connected across said tip and ring lines, said tone detector being responsive to a first tone signal originating from said central office; and
a timing means responsive to said tone detector to open said solid state switches for a predetermined time period and thereafter returning said switches to the normally closed position after said predetermined time period.

26. The tone activated remote disconnect device of claim 25 further including:
a second tone detector connected across said tip and ring lines responsive to a second tone signal originating from said central office; and
a first latching means connected to said switching device and responsive to said first and second tone detector means for opening said solid state switches in response to an output from said first tone detector means and closing said solid state switches in response to an output from said second tone detector means;
whereby the application by said central office of said first tone signal opens said solid state switching device preventing said subscriber from making outgoing calls while said auxiliary switch means permits the subscriber to receive calls, and the application by said central office of said second tone signal restores said subscriber to full service.

27. The tone activated remote disconnect device of claim 26 further including an off-hook simulating means connected across said tip and ring lines.

28. The tone activated remote disconnect device of claim 27 wherein said off-hook simulating means includes a ring counter connected across said tip and ring lines for activating said off-hook simulating means for a predetermined period after a predetermined number of rings.

29. The tone activated remote disconnect device of claim 28 wherein said solid state switch device includes an auxiliary switch means for activating said switch device in response to a ringing voltage from the central office.

30. The tone activated remote disconnect device of claim 29 wherein said auxiliary switch means includes a resistor connected across each of said solid state switches such that the opening of said switches connects the resistor within the tip and ring line for preventing said subscriber from making outgoing calls while allowing said subscriber to receive calls.

31. The tone activated remote disconnect device of claim 30 wherein said resistors are valued at 11k ohms.

32. The tone activated remote disconnect device of claim 31 further including:
a second switching device having at least one solid state switch connected in a parallel with said solid state switch of said first switching device;
said auxiliary switch means being connected in series with each of said solid state switches of said second switching device;
a third tone detector means connected across said tip and ring lines responsive to a third tone signal originating from said central office;
a second latching means connected to said second switching device and second and third tone detector means for opening said solid state switches of said second switching device in response to an output from said third tone detector means and closing said solid state switches of said second switching device in response to an output from said second tone detecting means;
whereby the application by said central office of said first tone signal opens the switches in said first switching device preventing said subscriber from making outgoing calls while said auxiliary switch means allows said subscriber to receive calls and the application by said central office of said second tone signal restores said subscriber to full service, and the application of said central office of said third tone signal opens the switches in second switching device de-activating said auxiliary switch means thereby preventing said subscriber from receiving or making calls.

33. The remote disconnect of claim 32 further including a means for providing a voice message on the tip and ring lines.

34. The tone activated remote disconnect device of claim 33 wherein each of said solid state switch devices includes:
at least one field effect transistor in each tip and ring circuit, each of said FETs being in series with its respective circuit;
at least one resistance-capacitance, time-constant circuit within a bridge circuit for normally energizing said FETs and rendering them conductive;
at least one circuit means for discharging said capacitor in the resistance-capacitance circuit in response to an output signal from said tone detector means;
whereby said FETs are rendered nonconductive by the discharge of said capacitor in said resistance-capacitance circuit.

35. The tone activated remote disconnect device of claim 33 wherein each of said solid state switch device includes:
first and second n-channel field effect transistors connected in series with said tip and ring circuits respectively;
first and second p-channel field effect transistors connected in series with said tip and ring circuits respectively;
a resistance-capacitance, time-constant circuit within a bridge circuit for each pair of n-channel and p-channel FETs normally energizing said FETs and rendering them conductive;
at least one tone detector means connected across said tip and ring circuit, said tone detector means generating an output in response to a tone control signal originating from said central office;
at least one circuit means for each pair of n-channel and p-channel FETs for discharging each of said capacitors in the said resistance-capacitance circuits in response to an output signal from said tone detector means;
whereby said FETs are rendered nonconductive by the respective discharge of the said capacitors in said resistance-capacitance circuit.

36. An automatic permanent release device for use in a telephone tip and ring circuit, said device being activated in response to a control signal from a telephone central office, said device comprising:
- a switching device having a first normally closed remotely actuated solid state switch connected in series with said tip line and a second normally closed remotely actuated solid state switch connected in series with said ring line;
- a tone detector connected across said tip and ring lines being responsive to a tone signal from said central office;
- a latching means connected to said switching device and responsive to said tone detector for opening said solid state switches in response to an output from said tone detector thereby setting said latching means;
- a time delay means connected between said tone detector and said latching means for delaying the setting for said latching means; and
- an on-hook detector means connected across said tip and ring lines and to said latching means for releasing said latching means in response to the telephone being restored on-hook, thereby closing said normally closed switch.

37. The device of claim 36 wherein said switching device includes a field effect transistor connected in series with each tip and ring line.

38. The device of claim 37 wherein said switching device includes an avalanche device for each FET connected across the source and drain terminals of the respective FET, each of said avalanche devices being poled to normally conduct from the central office to the subscriber,
- a circuit means for normally energizing said FETs and rendering said FETs conductive in response to a voltage across the tip and ring circuit,
- a diode bridge circuit connected across the tip and ring circuit for providing the proper polarity for energizing said FETs regardless of the polarity of the voltage across the tip and ring circuit, and
- an avalanche device for each FET connected across the gate and source terminal of each said FET.

39. The device of claim 38 wherein said time delay means includes a resistance-capacitance time constant circuit.

40. The device of claim 39 wherein said latching means includes a silicon control rectifier for each of said FETs, each SCR including a gate connected to said resistance-capacitance time constant circuit through a unilateral switch for triggering said SCR in response to the capacitor in said resistance-capacitance circuit being charged, said latching means further including a transistor having a base connected to the cathode of said SCR and collector and emitter terminals connected across the gate and source of the respective FET.

41. A DC remote disconnect device for connection within a telephone tip and ring circuit said device providing a remote disconnect means for a telephone subscriber in response to a control signal from a central telephone office, said device comprising:
- at least one field effect transistor in each tip and ring circuit, each of said FETs being in series with its respective circuit,
- a first resistance-capacitance, time-constant circuit for normally energizing said FETs and rendering said FETs conductive,
- a unilateral switch connected across said resistance-capacitance circuit for discharging said RC circuit when said unilateral switch is conducting,
- second and third resistance-capacitors circuits being connected between the respective tip and ring circuit and ground, each of said RC circuits being connected to an avalanche device for rendering said unilateral switch conductive in response to a DC control signal from the central office above a predetermined threshold voltage of said avalanche device.

42. The DC remote disconnect device of claim 41 wherein said avalanche device is a solid state bilateral switch.

43. The DC remote disconnect device of claim 42, wherein said solid state bilateral switch is a sidac.

44. The DC remote disconnect device of claim 43 further including a LED energized by said sidac and wherein said unilateral switch is a photosensitive transistor optically coupled to said LED.

45. The DC remote disconnect device of claim 44 wherein said avalanche device is a zener diode.

46. The DC remote disconnect device of claim 45, wherein said unilateral switch includes a field effect transistor having source and drain terminals connected across said capacitor in said first RC circuit, and a gate connected to said avalanche device, a fourth resistance-capacitor circuit connected to the gate of said FET for energizing said FET, a second avalanche device connected across said fourth RC circuit, and a third avalanche device connected across the source and drain terminals of said FET.

47. The DC remote disconnect device of claim 46 further including a second unilateral switch connected in series between the tip and ring lines and the gate of said first unilateral switch, said second unilateral switch being rendered conductive in response to said first avalanche device becoming conductive, said second unilateral switch passing the entire DC control signal to said first unilateral switch for energizing said first unilateral switch.

* * * * *